United States Patent
Lee et al.

(10) Patent No.: US 9,165,660 B2
(45) Date of Patent: Oct. 20, 2015

(54) NON-VOLATILE MEMORY DEVICES AND RELATED OPERATING METHODS

(71) Applicants: Dong-Jun Lee, Yongin-si (KR); Sungsu Moon, Hwaseong-si (KR); Jaihyuk Song, Seongnam-si (KR); Changsub Lee, Osan-si (KR)

(72) Inventors: Dong-Jun Lee, Yongin-si (KR); Sungsu Moon, Hwaseong-si (KR); Jaihyuk Song, Seongnam-si (KR); Changsub Lee, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/471,231

(22) Filed: Aug. 28, 2014

(65) Prior Publication Data

US 2015/0063037 A1 Mar. 5, 2015

(30) Foreign Application Priority Data

Aug. 29, 2013 (KR) .......................... 10-2013-0103470

(51) Int. Cl.
*G11C 16/04* (2006.01)
*G11C 16/10* (2006.01)
*G11C 16/26* (2006.01)

(52) U.S. Cl.
CPC ............ *G11C 16/10* (2013.01); *G11C 16/0483* (2013.01); *G11C 16/26* (2013.01)

(58) Field of Classification Search
CPC ..... G11C 16/10; G11C 16/0483; G11C 16/26
USPC ........................... 365/185.24, 185.17, 189.09
See application file for complete search history.

(56) References Cited

U.S. PATENT DOCUMENTS

| | | | |
|---|---|---|---|
| 6,614,688 B2 | 9/2003 | Jeong et al. | |
| 8,107,292 B2 | 1/2012 | Maejima | |
| 8,320,184 B2 | 11/2012 | Yang et al. | |
| 8,908,431 B2 * | 12/2014 | Shim et al. | 365/185.11 |
| 2011/0199825 A1 * | 8/2011 | Han et al. | 365/185.11 |
| 2012/0063235 A1 | 3/2012 | Yoon et al. | |
| 2012/0170376 A1 | 7/2012 | Lee et al. | |
| 2013/0010539 A1 | 1/2013 | Shim et al. | |
| 2013/0051146 A1 | 2/2013 | Yun et al. | |
| 2014/0226397 A1 | 8/2014 | Ahn et al. | |
| 2014/0247659 A1 * | 9/2014 | Dong et al. | 365/185.11 |

FOREIGN PATENT DOCUMENTS

KR 10-2010-0089511 A 8/2010
KR 10-2014-0107983 A 9/2014

* cited by examiner

*Primary Examiner* — Tuan T Nguyen
(74) *Attorney, Agent, or Firm* — Myers Bigel Sibley & Sajovec

(57) ABSTRACT

Non-volatile memory devices and related methods are provided. The non-volatile memory devices include a memory cell array having a plurality of cell strings, each cell string including: a plurality of memory cells stacked in a direction perpendicular to a substrate, a ground selection transistor between the plurality of memory cells and the substrate, and a string selection transistor between the plurality of memory cells and a bit line; an address decoder coupled to the plurality of memory cells in the plurality of cell strings through word lines, to the string selection transistors in the plurality of cell strings through string selection lines, and to the ground selection transistors in the plurality of cell strings through a ground selection line; a read/write circuit coupled to the string selection transistors in the plurality of cell strings through the bit lines; and control logic configured to adjust a substrate voltage applied to the substrate such that threshold voltages of the ground selection transistors are higher than a predetermined level during read operations for at least one of the plurality of memory cells in the plurality of cell strings.

20 Claims, 20 Drawing Sheets

NON-VOLATILE MEMORY DEVICES AND RELATED OPERATING METHODS

CROSS-REFERENCE TO RELATED APPLICATION

The present application claims priority under 35 U.S.C. §119 to Korean Patent Application No. 10-2013-0103470 filed Aug. 29, 2013, in the Korean Intellectual Property Office, the entire contents of which are hereby incorporated herein by reference as if set forth in its entirety.

FIELD

The present inventive concept relates generally to semiconductor memory devices and, more particularly to, nonvolatile memory devices and related methods of operating.

BACKGROUND

A semiconductor memory device is a memory device which is fabricated using semiconductor materials, such as silicon (Si), germanium (Ge), gallium arsenide (GaAs), indium phosphide (InP), and the like. Semiconductor memory devices are typically classified into volatile memory devices and nonvolatile memory devices.

The volatile memory devices may lose stored contents when they are powered off. The volatile memory devices may include, for example, a Static RAM (SRAM), a Dynamic RAM (DRAM), a Synchronous DRAM (SDRAM), etc. Nonvolatile memory devices, on the other hand, may retain stored contents even when powered off. The nonvolatile memory devices may include, for example, a Read Only Memory (ROM), a Programmable ROM (PROM), an Electrically Programmable ROM (EPROM), an Electrically Erasable and Programmable ROM (EEPROM), a flash memory device, a Phase-change RAM (PRAM), a Magnetic RAM (MRAM), a Resistive RAM (RRAM), a Ferroelectric RAM (FRAM), etc. The flash memory devices are divided into a NAND flash memory device and a NOR flash memory device.

Research on three-dimensional semiconductor memory devices is being performed to improve a degree of integration of semiconductor memory devices. A Three-dimensional semiconductor memory device has a different structure from that of a two-dimensional semiconductor memory device. For this reason, various methods for driving three-dimensional semiconductor memory devices are being researched.

SUMMARY

Some embodiments of the present inventive concept provide nonvolatile memory devices including a memory cell array having a plurality of cell strings, each cell string including a plurality of memory cells stacked in a direction perpendicular to a substrate, a ground selection transistor between the plurality of memory cells and the substrate, and a string selection transistor between the plurality of memory cells and a bit line; an address decoder coupled to the plurality of memory cells in the plurality of cell strings through word lines, to the string selection transistors in the plurality of cell strings through string selection lines, and to the ground selection transistors in the plurality of cell strings through a ground selection line; a read/write circuit coupled to the string selection transistors in the plurality of cell strings through the bit lines; and control logic configured to adjust a substrate voltage applied to the substrate such that threshold voltages of the ground selection transistors are higher than a predetermined level during read operations for at least one of the plurality of memory cells in the plurality of cell strings.

In further embodiments, the predetermined level may be higher than one of a threshold voltage distribution of erase states of the plurality of memory cells and a threshold voltage distribution of program states of the plurality of memory cells.

In still further embodiments, the substrate may be a p-type substrate; and the control logic may be configured to adjust the substrate voltage to a negative voltage when the substrate is p-type.

In some embodiments, the substrate may be an n-type substrate; and the control logic may be configured to adjust the substrate voltage to a positive voltage when the substrate is n-type.

In further embodiments, the read operation may include an operation where a selection read voltage is applied to a selected one of the word lines and a non-selection read voltage is applied to an unselected one of the word lines and a recovery operation wherein the non-selection read voltage applied is lowered to a ground voltage.

In still further embodiments, the control logic may be configured to supply the adjusted substrate voltage to the substrate before the recovery operation.

In some embodiments, the control logic may be configured to adjust the adjusted substrate voltage to ground voltage after the recovery operation is completed.

In further embodiments, the control logic may be configured to lower a voltage supplied to the ground selection line to a negative voltage during the recovery operation.

In still further embodiments, the control logic may be configured to lower a voltage supplied to the ground selection line to a negative voltage before the recovery operation.

Some embodiments of the present inventive concept provide methods of operating a nonvolatile memory device. The nonvolatile memory device includes a plurality of cell strings, each cell string including a plurality of memory cells stacked in a direction perpendicular to a substrate, a ground selection transistor between the plurality of memory cells and the substrate, and a string selection transistor between the plurality of memory cells and a bit line. The method includes performing a read operation on at least one of the plurality of memory cells in the plurality of cell strings; and adjusting a substrate voltage supplied to a substrate such that a threshold voltage of the ground selection transistor is higher than a predetermined level during the read operation.

In further embodiments, performing a read operation comprises applying a selection read voltage to a selected word line and a non-selection read voltage to an unselected word line; and performing a recovery operation in which the applied selection read voltage and non-selection read voltage are lowered to a ground voltage.

In still further embodiments, adjusting the substrate voltage may include adjusting the substrate voltage before the recovery operation.

In some embodiments, adjusting the substrate voltage may further include adjusting the adjusted substrate voltage to a ground voltage after the recovery operation is complete.

In further embodiments, the method may further include lowering a voltage supplied to the ground selection line to a negative voltage during the recovery operation.

In still further embodiments, the method may further include lowering a voltage supplied to the ground selection line to a negative voltage before the recovery operation.

In some embodiments, each cell string may include a channel film isolated from the substrate; the plurality of memory cells may be formed on the channel film; the string selection transistor may be between the channel film and a bit line; the ground selection transistor may be between the channel film and a common source line; at least one of the string and ground selection transistors may be formed on the substrate; and adjusting a substrate voltage supplied to the substrate may further include adjusting the substrate voltage supplied to the substrate such that the threshold voltage of at least one of the string and ground selection transistors is higher than a predetermined level during the read operation.

Further embodiments of the present inventive concept provide methods of operating a non-volatile memory device including controlling a substrate voltage such that a threshold voltage of a ground selection transistor increases during a read operation. Controlling the substrate voltage includes isolating channels from a common source line during a recovery period of the read operation; and reducing a potential difference between locally boosted channels and hot electrons generated at a boundary zone.

In still further embodiments, the non-volatile memory device may include a plurality of cell strings, each cell string including a plurality of memory cells stacked in a direction perpendicular to a substrate, a ground selection transistor between the plurality of memory cells and the substrate, and a string selection transistor between the plurality of memory cells and a bit line; and controlling the substrate voltage may be preceded by performing the read operation on at least one of the plurality of memory cells in the plurality of cell strings.

In some embodiments, controlling the substrate voltage may further include adjusting the substrate voltage supplied to a substrate such that a threshold voltage of the ground selection transistor is higher than a predetermined level during the read operation.

In further embodiments, the method may further include one of lowering a voltage supplied to the ground selection line to a negative voltage during the recovery period; and lowering a voltage supplied to the ground selection line to a negative voltage before the recovery period.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Figure 1:
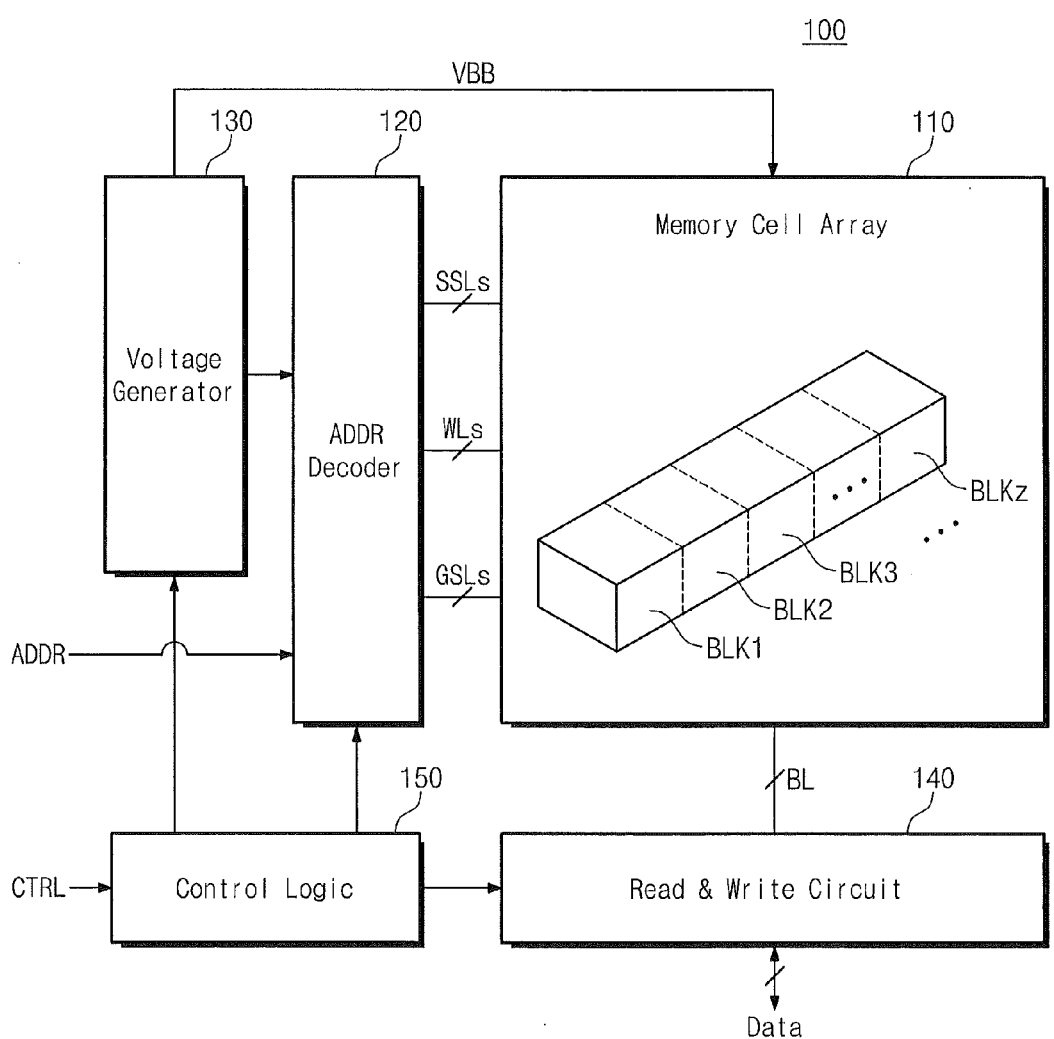
FIG. 1 is a block diagram schematically illustrating nonvolatile memory devices according to some embodiments of the present inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Although embodiments of the inventive concept will be described with reference to a NAND flash memory devices, it will be understood that embodiments of the present inventive concept are not limited thereto to this configuration. For example, the inventive concept may be applied to nonvolatile memory devices, such as an Electrically Erasable and Programmable ROM (EEPROM), a NOR flash memory, a Phase-change RAM (PRAM), a Magnetic RAM (MRAM), a Resistive RAM (RRAM), a Ferroelectric RAM (FRAM), and the like, without departing from the scope of the present inventive concept.

During a read operation, a nonvolatile memory device according to some embodiments of the present inventive concept adjusts a substrate voltage applied to a substrate such that a threshold voltage of a ground selection transistor becomes higher than a threshold value. In this case, since a potential difference between channels in a cell string is reduced, the likelihood of read disturbance may be reduced, or possibly prevented. Thus, the reliability of the nonvolatile memory device and its operating method may be improved as will be discussed further herein with respect to FIGS. 1 through 21.

Referring first to FIG. 1, a block diagram schematically illustrating a nonvolatile memory device 100 according to some embodiments of the inventive concept will be discussed. Referring to FIG. 1, a nonvolatile memory device 100 comprises a memory cell array 110, an address decoder 120, a voltage generator 130, a read/write circuit 140, and control logic 150.

The memory cell array 110 is connected to the address decoder 120 through word lines WL, string select lines SSL, and ground selection lines GSL and to the read/write circuit 140 through bit lines BL. The memory cell array 110 comprises a plurality of memory blocks BLK1 to BLKz, each of which includes a plurality of memory cells and a plurality of selection transistors. The memory cells may be connected to the word lines, and the selection transistors may be connected to the string select lines SSLs or the ground selection lines GSLs. The memory cells of each memory block may be stacked in a direction perpendicular to a substrate to form a three-dimensional structure. Each memory cell may store one or more bits without departing from the scope of the present inventive concept.

The address decoder 120 is connected to the memory cell array 110 through the word lines WLs, the string select lines SSLs, and the ground selection lines GSLs. The address decoder 120 is configured to operate in response to a control of the control logic 150. The address decoder 120 receives an address ADDR from an external device.

The address decoder 120 is configured to decode a row address of the received address ADDR. The address decoder 120 selects the word lines WLs, the string select lines SSLs, and the ground selection lines GSLs based on the decoded row address. The address decoder 120 receives various voltages from the voltage generator 130 to transfer the received voltages to selected and unselected string selection lines SSLs, word lines WLs and ground selection lines GSLs, respectively.

The address decoder 120 is configured to decode a column address of the received address ADDR. The address decoder 120 transfers the decoded column address to the read/write circuit 140. In example embodiments, the address decoder 120 may include components such as a row decoder, a column address, an address buffer, and so on.

The voltage generator 130 is configured to generate various voltages for the nonvolatile memory device 100. For example, the voltage generator 130 generates a plurality of program voltages, a plurality of pass voltages, a plurality of selection read voltages, a plurality of non-selection read voltages, and a substrate voltage VBB provided to a substrate of the memory cell array 110. In some embodiments, the voltage generator 130 may generate the substrate voltage VBB being a negative voltage or a positive voltage according to a control of the control logic 150.

The read/write circuit 140 is connected to the memory cell array 110 through bit lines BL, and exchanges data with the external device. The read/write circuit 140 operates in response to a control of the control logic 150. The read/write circuit 140 receives the decoded column address from the address decoder 120. The read/write circuit 140 selects the bit lines BL using the decoded column address.

The read/write circuit 140 may receive data from the external device, and may write the received data at the memory cell array 110. The read/write circuit 140 may read data from the memory cell array 110 to transfer the read data to the external device. The read/write circuit 140 may read data from a first storage region of the memory cell array 110 to write the read data to a second storage region of the memory cell array 110. For example, the read/write circuit 140 may perform a copy-back operation.

The read/write circuit 140 may include components such as a page buffer, or page register, a column selection circuit, a data buffer, and so on. In some embodiments, the read/write circuit 140 may include components such as a sense amplifier, a write driver, a column selection circuit, a data buffer, and so on.

The control logic 150 is connected to the address decoder 120 and the read/write circuit 140. The control logic 150 is configured to control the overall operation of the nonvolatile memory device 100. The control logic 150 operates in response to a control signal CTRL and a command CMD transferred from the external device. In exemplary embodiments, the control logic 150 adjusts the substrate voltage VBB during a read operation.

The nonvolatile memory device 100 according to some embodiments of the inventive concept adjusts the substrate voltage VBB during a read operation to reduce, or possibly prevent, read disturbance. For example, the control logic 150 controls the substrate voltage VBB such that a threshold voltage of a ground selection transistor becomes higher than a predetermined level.

Some embodiments of read operations of the nonvolatile memory device 100 are discussed herein with reference to accompanying drawings. However, it will be understood that the inventive concept is not limited to these embodiments. For example, the inventive concept may be applied to, for example, program verification operations and erase verification operations of the nonvolatile memory device 100.

Figure 2:
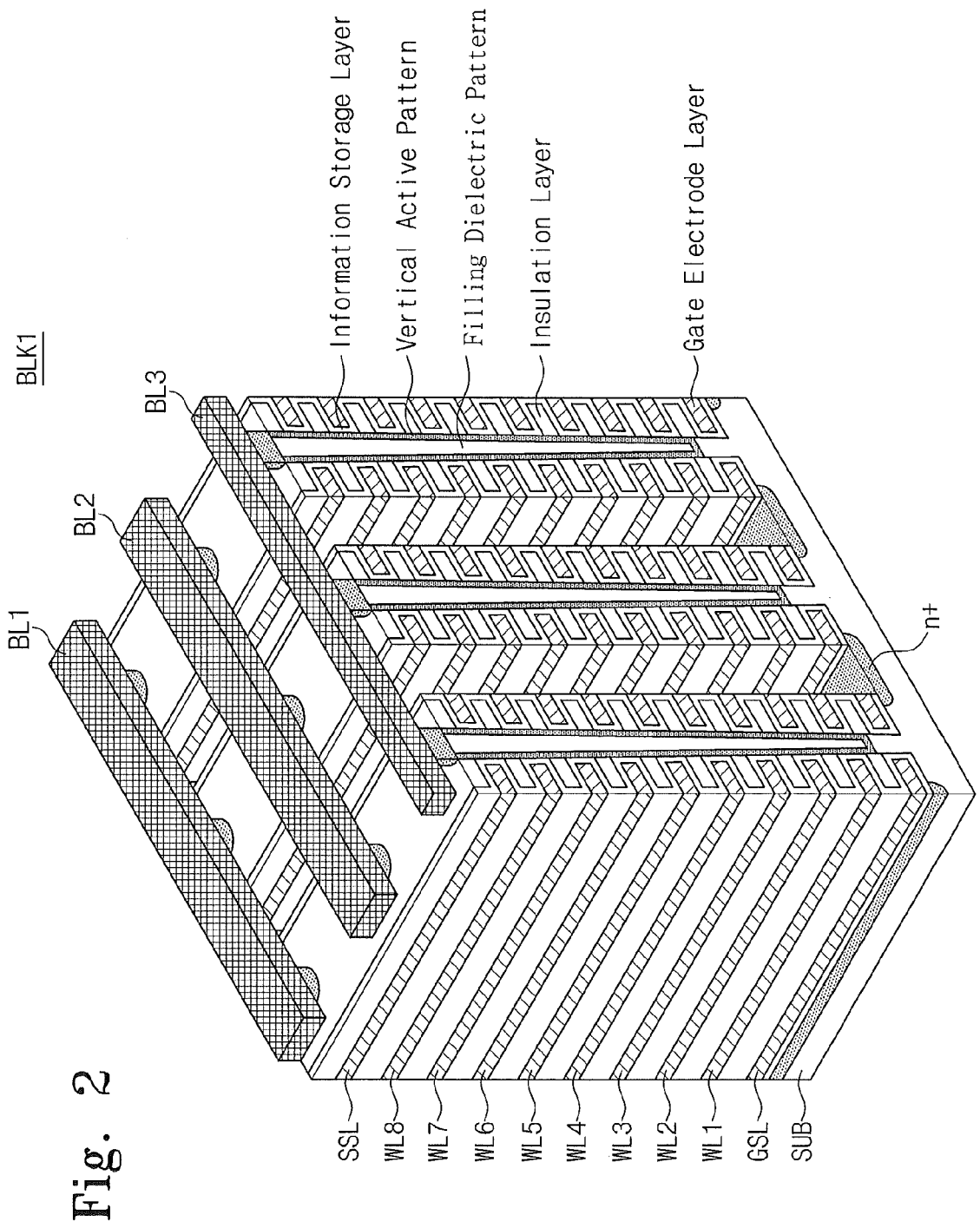
FIG. 2 is a perspective view schematically illustrating a three-dimensional structure of a memory block BLK1 illustrated in FIG. 1 in accordance with some embodiments of the present inventive concept.

Referring now to FIG. 2, a perspective view schematically illustrating a three-dimensional structure of a memory block BLK1 illustrated in FIG. 1 will be discussed. As illustrated in FIG. 2, a memory block BLK1 may be formed in a direction perpendicular to a substrate SUB. The substrate SUB may be a well having a first conductive type. For example, the substrate SUB is a p-well formed by injecting III-elements (e.g., boron) in the substrate SUB. For example, the substrate SUB is a pocket p-well that is formed within an n-well. Below, it is assumed that the substrate SUB is a p-well (or, a pocket p-well). However, it will be understood that embodiments of the inventive concept are not limited thereto. A gate electrode layer and an insulation layer may be deposited on the substrate SUB in turn without departing from the scope of the present inventive concept.

An information storage layer is formed between the gate electrode layer and the insulation layer. The information storage layer is formed of a tunnel insulation layer, a charge storage layer and a blocking insulation layer.

If the gate electrode layer and the insulation layer are patterned in a vertical direction, a V-shaped pillar is formed. The pillar is connected to the substrate SUB via the gate electrode layer and the insulation layer. An inner portion of the pillar is a filling dielectric pattern and may be formed of an insulation material, such as silicon oxide. An outer portion of the pillar is a vertical active pattern and may be formed of a channel semiconductor.

In some embodiments, a ground selection transistor GST is formed on the substrate SUB and is influenced by a body effect according to a variation of a substrate voltage. In other words, a threshold voltage of the ground selection transistor GST may be adjusted by controlling the substrate voltage. For example, in the event that the substrate SUB is p-type and the substrate voltage is a negative voltage, a threshold voltage of the ground selection transistor GST is increased. In the event that the substrate SUB is n-type and the substrate voltage is a positive voltage, a threshold voltage of the ground selection transistor GST is increased. At this time, memory cells are not influenced by the substrate voltage. The reason is that the memory cells are electrically separated from the substrate SUB.

In some embodiments, the ground selection transistor GST has a threshold voltage higher than a predetermined level according to a variation of the substrate voltage. The predetermined level may be a level higher than a threshold voltage distribution corresponding to erase states of memory cells or a threshold voltage distribution corresponding to program states thereof.

The gate electrode layer of the memory block BLK1 is connected to a ground selection line GSL, word lines WL1 to WL8 and a string selection line SSL. In the memory block BLK1, a pillar is connected to a plurality of bit lines BL1, BL2, and BL3. In FIG. 2, there is illustrated an embodiment where one memory block BLK1 includes two selection lines SSL and GSL, eight word lines WL1 to WL8 and three bit lines BL1, BL2, and B3. However, the inventive concept are not limited thereto. The number of selection lines, the number of word lines and the number of bit lines may be changed to be increased or decreased.

Figure 3:
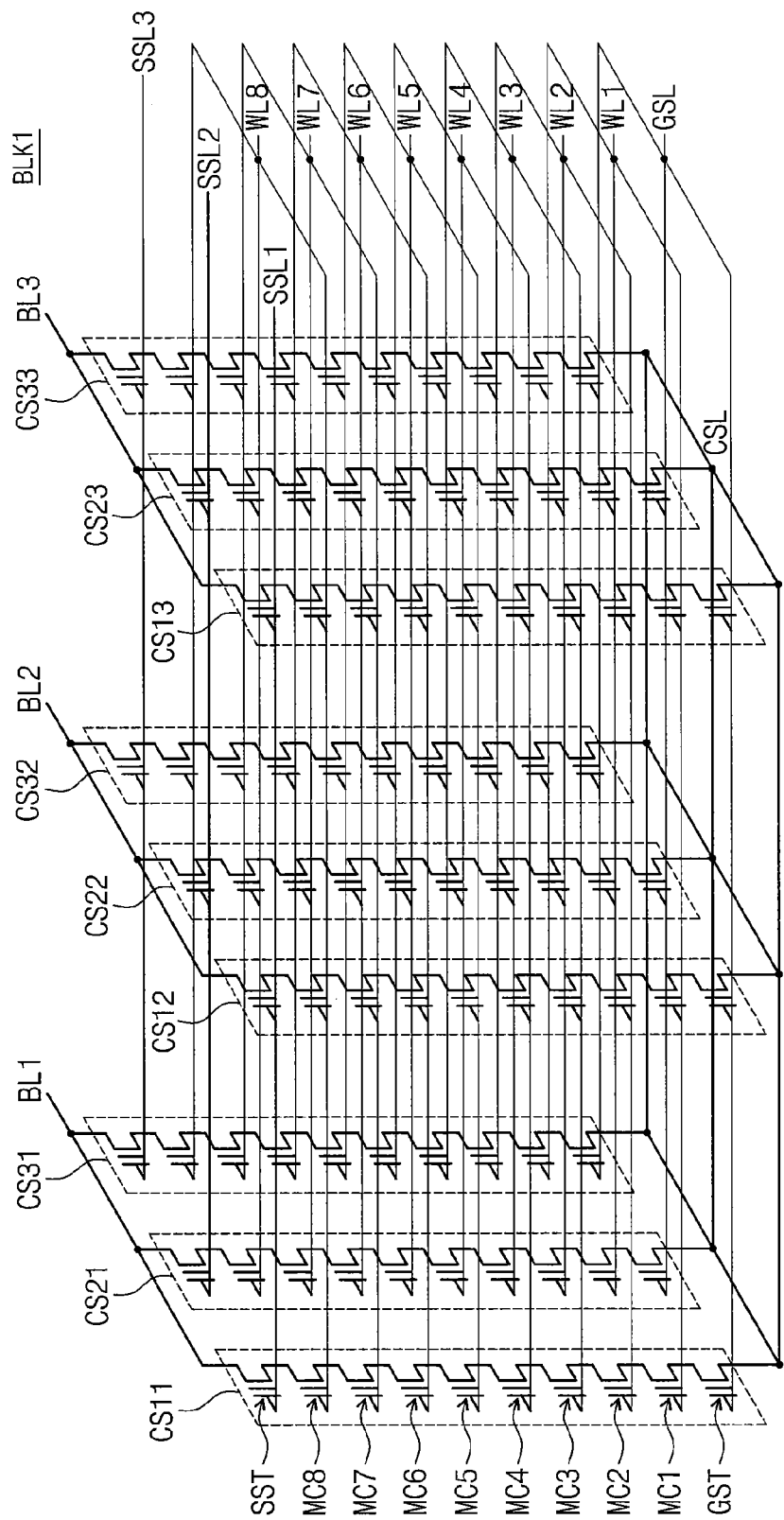
FIG. 3 is a circuit diagram schematically illustrating an equivalent circuit of a memory block BLK1 illustrated in FIG. 2 in accordance with some embodiments of the present inventive concept.

Referring now to FIG. 3, a circuit diagram schematically illustrating an equivalent circuit of a memory block BLK1 shown in FIG. 2 will be discussed. As illustrated in FIG. 3, cell strings CS11 to CS33 are connected between bit lines BL1 to BL3 and a common source line CSL. Each cell string (for example, CS11) includes a string selection transistor SST, a plurality of memory cells MC1 to MC8, and a ground selection transistor GST. Here, the cell string is also referred to as a NAND string.

The string selection transistors SST may be connected with a string selection line. The string selection line SSL is divided into first to third string selection lines SSL1 to SSL3. The memory cells MC1 to MC8 are connected to corresponding word lines WL1 to WL8, respectively. Word lines (e.g., WL4) at the same height are connected in common. The ground selection transistors GST are connected to a ground selection line GSL. The cell strings are connected to the ground selection line GSL. In each cell string, the string selection transistor SST is connected to a bit line and the ground selection transistor GST is connected to the common source line CSL.

A memory block BLK1 shown in FIGS. 2 and 3 is exemplary. It will be understood that embodiments of the inventive concept are not limited to the memory block BLK1 shown in FIGS. 2 and 3. For example, the number of rows of cell strings may be increased or decreased. As the number of rows of cell strings is changed, the number of string or ground selection lines connected to rows of cell strings and the number of cell strings connected to a bit line are also changed.

The number of columns of cell strings may be increased or decreased. As the number of cell strings is changed, the number of bit lines connected to columns of cell strings and the number of cell strings connected to a string selection line are also changed.

A height of each cell string may be increased or decreased. For example, the number of memory cells stacked in each cell string may be increased or decreased. As the number of memory cells stacked in each cell string is changed, the number of word lines is also changed. For example, the number of ground or string selection transistors included in each cell string may be increased. As the number of ground or string selection transistors included in each cell string is changed, the number of string or ground selection lines is also changed. If the number of string or ground selection transistors is increased, ground or string selection transistors are stacked in the same manner that the memory cells MC1 to MC8 are stacked.

In some embodiments, read and write operations are performed by a row unit. For example, the cell strings CS11 to CS33 may be selected by a row unit by the string selection lines SSL1 to SSL3.

Read and write operations on a selected row of cell strings are performed by a page unit. A page may be a row of memory cells connected to a word line. In a selected row of cell strings, memory cells are selected by a page unit by the word lines WL1 to WL8.

Figure 4:
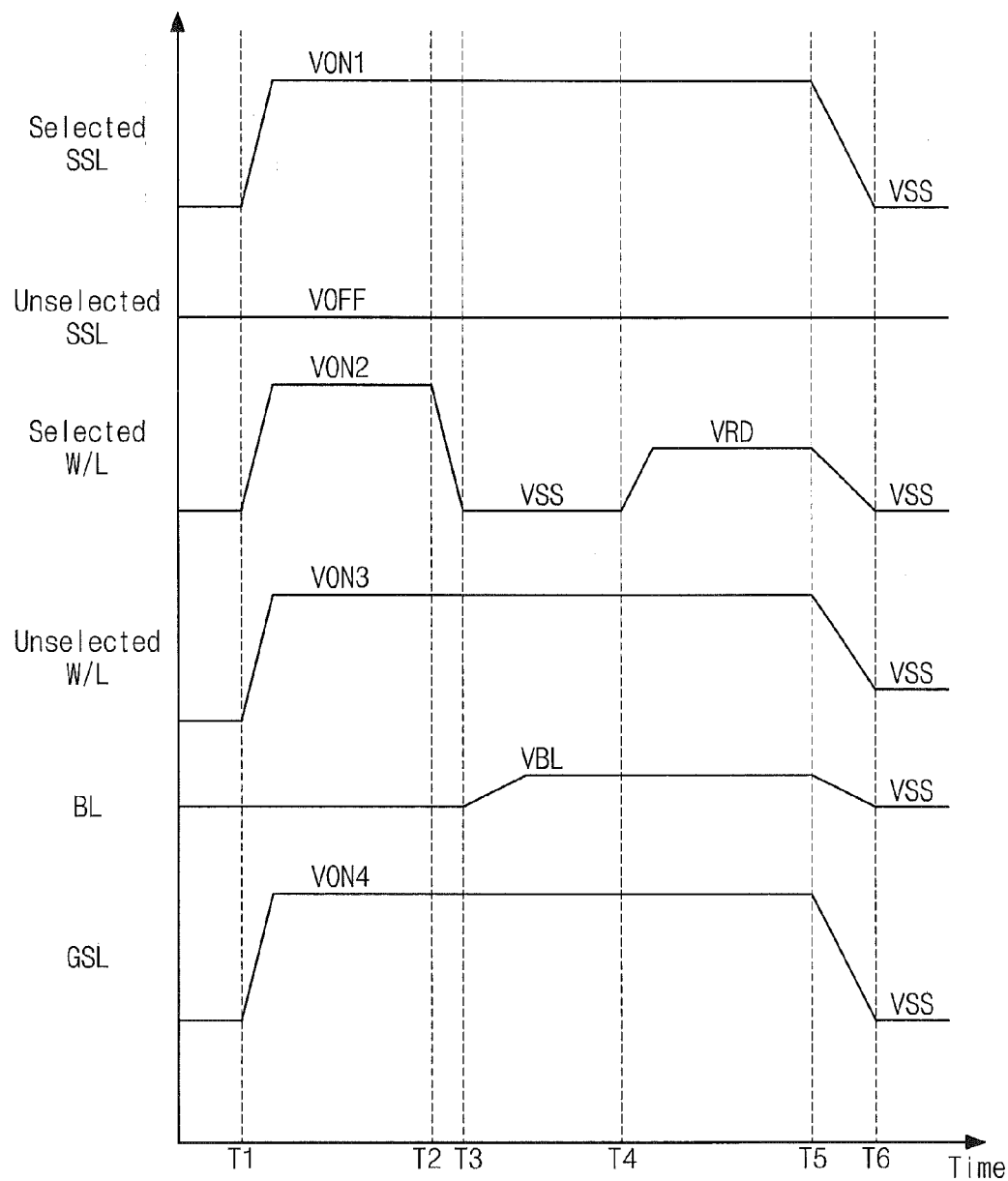
FIG. 4 is a timing diagram schematically illustrating a read operation of a nonvolatile memory device illustrated in FIG. 1 in accordance with some embodiments of the present inventive concept.

Referring now to FIG. 4, a timing diagram schematically illustrating a read operation of a nonvolatile memory device shown in FIG. 1 will be discussed. Referring to FIGS. 3 and 4, at T1, a first turn-on voltage VON1 is applied to a selected string selection line. The first turn-on voltage VON1 may be a high voltage. The first turn-on voltage VON1 may be a non-selection read voltage VREAD. The non-selection read voltage VREAD has a voltage level sufficient to turn on all memory cells regardless of their threshold voltages.

A turn-off voltage VOFF is applied to an unselected string selection line. The turn-off voltage VOFF may be, for example, a ground voltage VSS.

A second turn-on voltage VON2 is applied to a selected word line. The second turn-on voltage VON2 may be the non-selection read voltage VREAD. Alternatively, the second turn-on voltage VON2 may be a high voltage lower than the non-selection read voltage VREAD.

A third turn-on voltage VON3 is applied to unselected word lines. The third turn-on voltage VON3 may be the non-selection read voltage VREAD.

A fourth turn-on voltage VON4 is applied to a ground selection line GSL. The fourth turn-on voltage VON4 may be the non-selection read voltage VREAD.

At T2, a voltage of the selected word line starts to be lowered toward a ground voltage.

At T3, a bit line voltage VBL is applied to bit lines BL. The bit line voltage VBL may be a positive voltage. The bit line voltage VBL may be a pre-charge voltage.

At T4, a selection read voltage VRD is applied to the selected word line. The selection read voltage VRD may have a voltage level belonging to a threshold voltage distribution range of memory cells. In some embodiments, the selection read voltage VRD may be a program verification voltage of a nonvolatile memory device.

Between T5 and T6, string selection lines SSL1 to SSL3, word lines WL1 to WL8 and a ground selection line GSL are discharged. For example, the ground voltage VSS is applied to the string selection lines SSL1 to SSL3, the word lines WL1 to WL8 and the ground selection line GSL. A period where the string selection lines SSL1 to SSL3, the word lines WL1 to WL8 and the ground selection line GSL are discharged is referred to as a recovery period.

In some embodiments, the second turn-on voltage applied to the selected word line may be a pre-pulse. The pre-pulse may be a voltage for adjusting a potential of channels of cell strings CS11 to CS33 uniformly before a read operation is performed. In further embodiments, the pre-pulse may be skipped. In other words, the selection read voltage VRD is directly applied to the selected word line without applying of the second turn-on voltage VON2. In some embodiments, the second turn-on voltage VON2 and the selection read voltage VRD may be continuously applied without discharging of the second turn-on voltage VON2.

Figure 5:
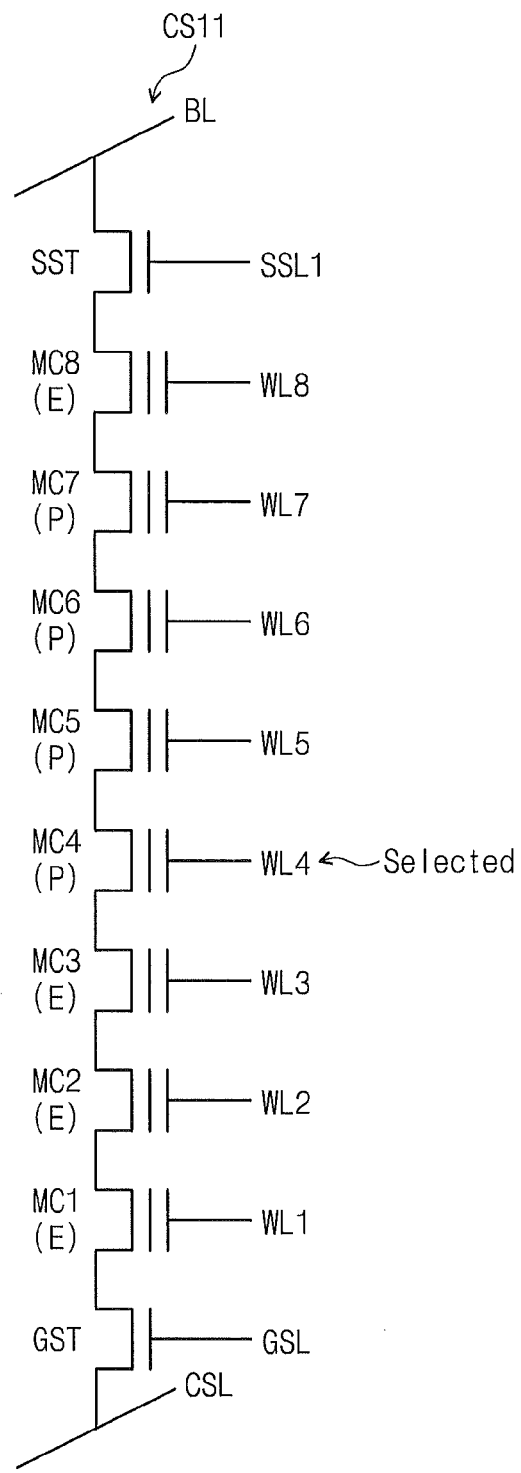
FIG. 5 is a diagram schematically illustrating a cell string experiencing a read operation discussed with reference to FIG. 4 in accordance with some embodiments of the present inventive concept.

Referring now to FIG. 5, a diagram schematically illustrating a cell string experiencing a read operation described with reference to FIG. 4 will be discussed. As illustrated in FIG. 5, a cell string CS11 is illustrated as an example. A cell string CS11 includes first to eighth memory cells MC1 to MC8, a string selection transistor SST and a ground selection transistor GST. The first to eighth memory cells MC1 to MC8 are connected to first to eighth word lines WL1 to WL8, respectively. It is assumed that memory cells MC1 to MC3 and MC8 are at an erase state E and memory cells MC4 to MC7 are at a program state P, the fourth word line is a selected word line, and the fourth memory cell MC4 is a selected memory cell. However, it will be understood that embodiments of the inventive concept are not limited to this configuration. For example, the memory cells MC1 to MC8 may be formed of multi-level cells (MLCs) each storing two or more data bits.

Figure 6:
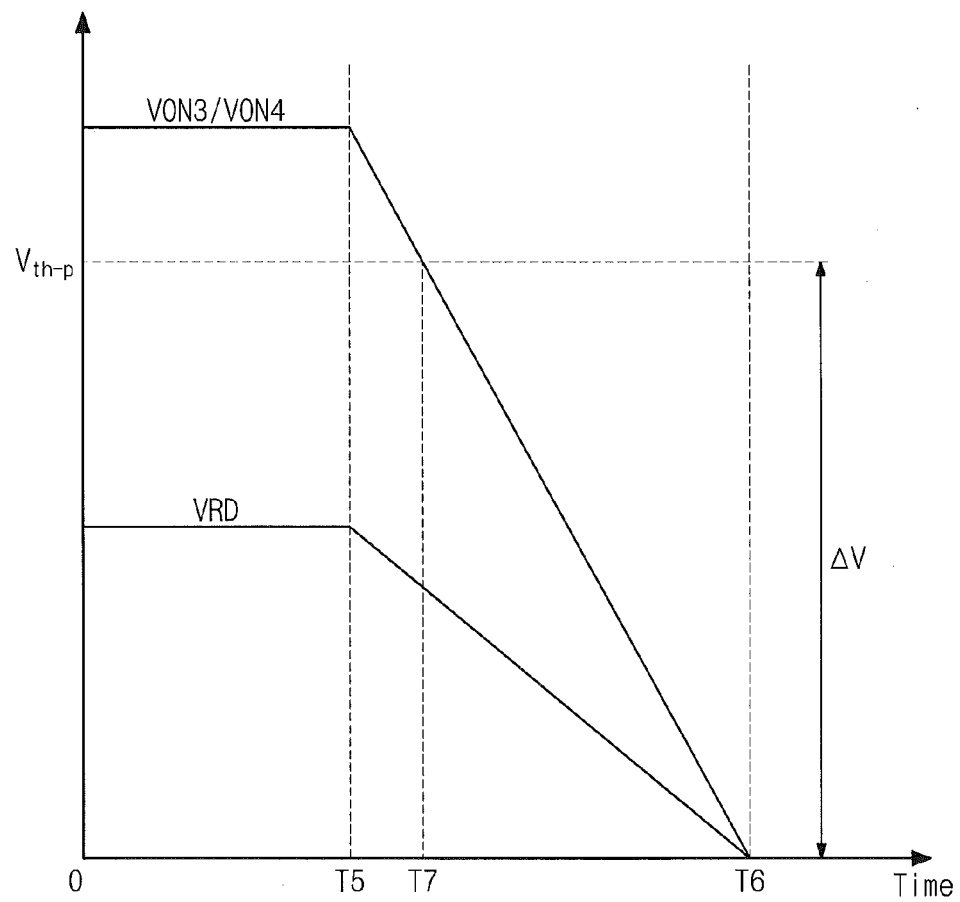
FIG. 6 is a detailed timing diagram of a recovery period shown in FIG. 4 in accordance with some embodiments of the present inventive concept.

Referring now to FIG. 6, a detailed timing diagram of a recovery period shown in FIG. 4 will be discussed. Referring to FIGS. 4 and 6, at T5, voltages of unselected word lines are a third turn-on voltage VON3, a voltage of a selected word line is a selection read voltage VRD, and a voltage of a ground selection line GSL is a fourth turn-on voltage VON4. At T5, voltages of the unselected word lines, the selected word line and the ground selection line start to be discharged to a ground voltage VSS.

In some embodiments, a threshold voltage of each of the memory cells MC4 to MC7 having a program state is '$V_{th\_P}$'. During a recovery period T5 to T6, the selected memory cell MC4 maintains a turn-off state. At T7 when a third turn-on voltage VON3 is lower than the threshold voltage $V_{th\_P}$, the memory cells MC5, MC6 and MC7 are turned off. The memory cells MC1, MC2, MC3, and MC8 each having an erase state maintain a turn-on state.

The memory cells MC1 to MC8 stacked in a direction perpendicular to a substrate SUB have thin film channels. The channels of the memory cells MC1 to MC8 are connected to the substrate SUB through a ground selection transistor GST, not directly connected to the substrate SUB. Thus, at T7, if the memory cells MC4 to MC7 are turned off, channels of the memory cells MC4 to MC7 are electrically isolated from channels of other memory cells MC1 to MC3 and MC8. That is, at T7, channels of the turned-off memory cells MC4 to MC7 are separated from channels of the memory cells MC1 to MC3 and MC8. Channels of the memory cells MC3 to MC5 are separated and floated.

The third turn-on voltage VON3 applied to the memory cells MC5 to MC7 from T7 to T6 is decreased by a voltage difference ΔV. Floated channels of the memory cells MC5 to MC7 are negatively boosted by the voltage difference ΔV in a negative direction.

Figure 7:
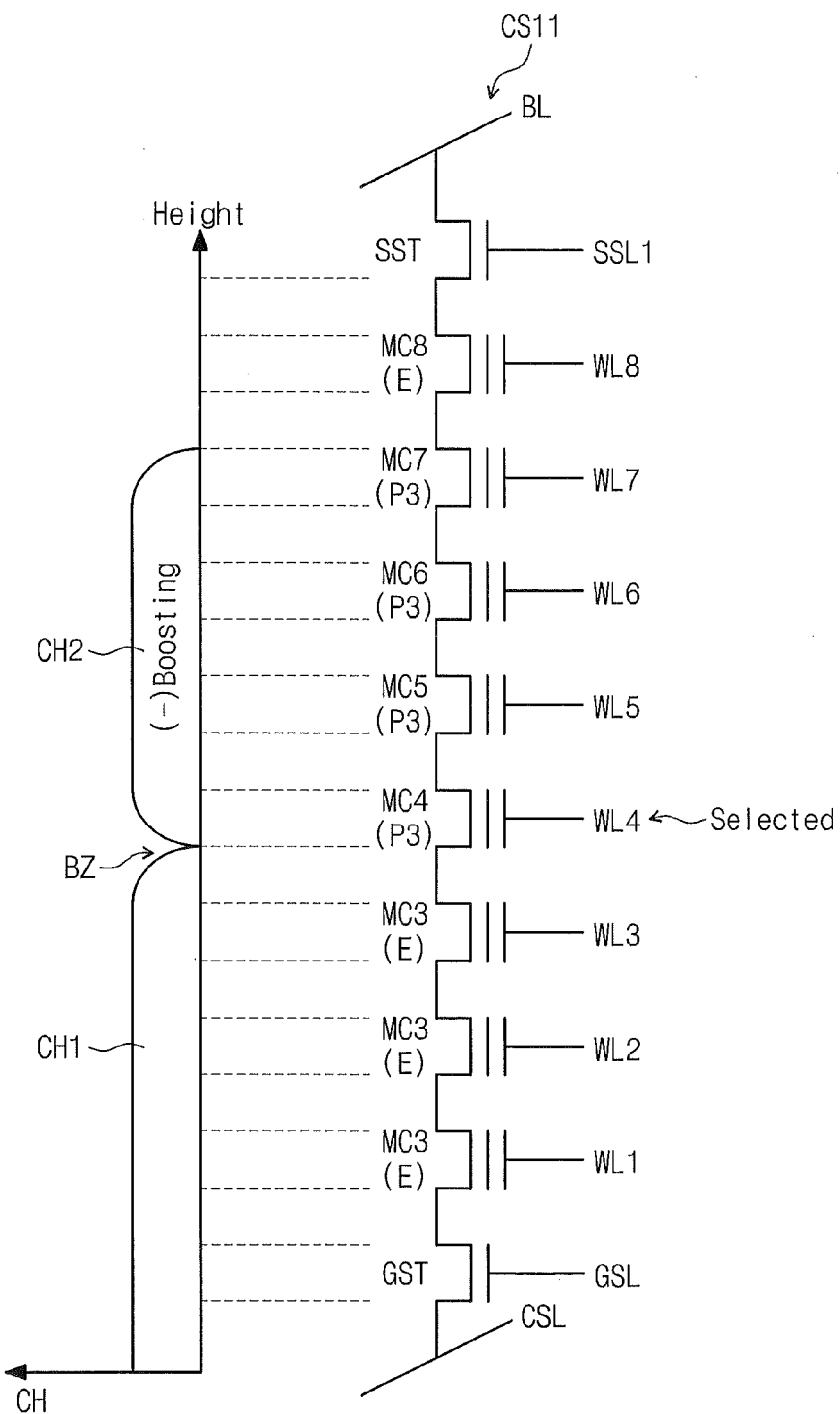
FIG. 7 is a diagram schematically illustrating a state of channels of cell strings CS11 at T7 shown in FIG. 6 in accordance with some embodiments of the present inventive concept.

Referring now to FIG. 7, a diagram schematically illustrating a state of channels of cell strings CS11 at T7 shown in FIG. 6 will be discussed. Referring to FIGS. 6 and 7, a ground selection transistor GST and memory cells MC1 to MC3 are turned on, and a first channel CH1 is formed. Memory cells MC4 to MC7 are turned off, and a second channel CH2 is formed.

A low voltage or a ground voltage is supplied to the first channel CH1 from a common source line CSL. Thus, a potential of the first channel CH1 maintains the low voltage or the ground voltage VSS between T7 and T6. The second channel CH2 is floated. Thus, a potential of the second channel CH2 is negatively boosted to a negative voltage between T7 and T6.

A boundary zone BZ exists between the first channel CH1 and the second channel CH2. A strong electric field is generated at the boundary zone BZ due to a potential difference between the first channel CH1 and the second channel CH2. Hot electrons are generated by the electric field generated at the boundary zone BZ. The hot electrons are injected into adjacent memory cells MC3 and MC4, so that threshold voltages of the memory cells MC3 and MC4 are varied. That is, as program states of the memory cells MC3 and MC4 are changed, read disturbance may occur.

Figure 8:
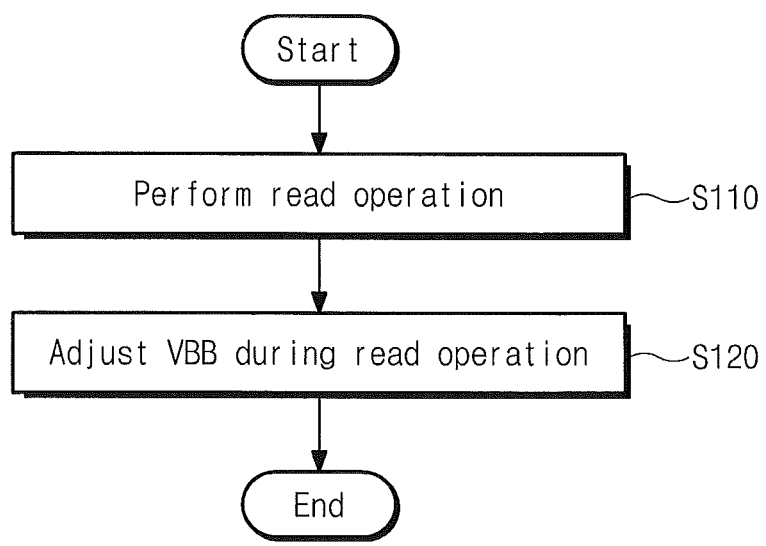
FIG. 8 is a flow chart schematically illustrating steps in an operating method of nonvolatile memory devices according some embodiments of the inventive concept.

Referring to FIG. 8, a flow chart schematically illustrating operations of nonvolatile memory devices according to some embodiments of the inventive concept will be discussed. Referring to FIGS. 1, 4, 6, and 8, operations begin at block S110, by a nonvolatile memory device 100 performing a read operation. For example, the nonvolatile memory device 100 performs a read operation based on a read manner described with reference to FIG. 4.

Operations continue at block S120 by the nonvolatile memory device 100 controlling a substrate voltage VBB during the read operation. For example, in the event that a substrate SUB of the nonvolatile memory device 100 is p-type, the nonvolatile memory device adjusts the substrate voltage VBB to a negative voltage before a recovery period T5 to T6. If the substrate SUB of the nonvolatile memory device 100 is n-type, the nonvolatile memory device may adjust the substrate voltage VBB to a positive voltage.

As the substrate voltage VBB is adjusted, a threshold voltage of a ground selection transistor GST formed on the substrate SUB is increased by a body effect. In other words, a potential of a first channel CH1 is negatively boosted by floating the first channel CH1 at T7, that is, is lowered to a negative voltage. Thus, since first and second channels CH1 and CH2 are negative boosted at the same time, a potential difference between the first channel CH1 and the second channel CH2 is reduced. In these embodiments, generation of hot electrons is reduced, so that read disturbance is improved.

Figure 9:
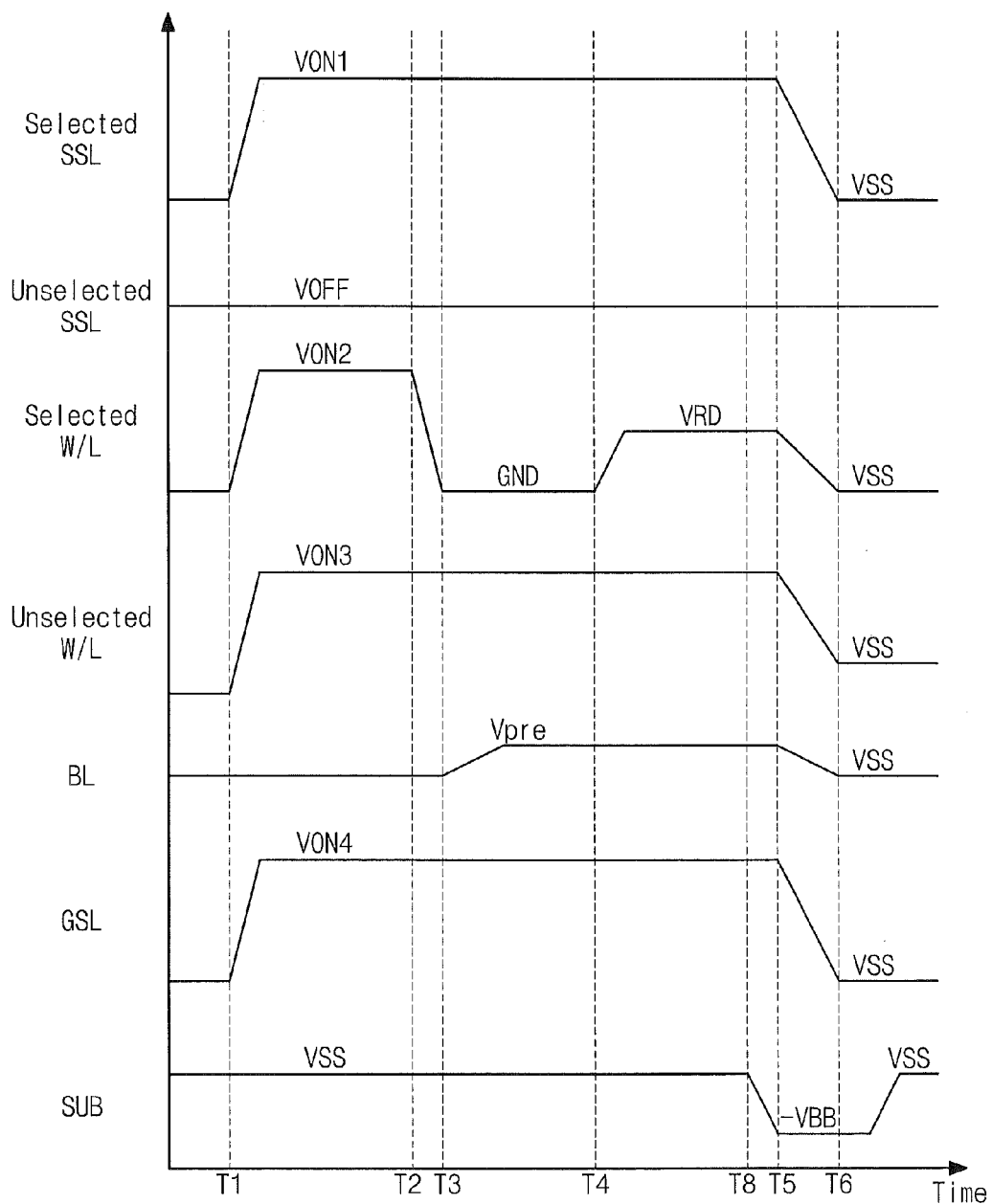
FIG. 9 is a timing diagram schematically illustrating operations of a nonvolatile memory device shown in FIG. 8 according to some embodiments of the inventive concept.

Referring now to FIG. 9, a timing diagram schematically illustrating an operation of a nonvolatile memory device shown in FIG. 8 according to some embodiments of the inventive concept will be discussed. As illustrated in FIG. 9, voltages supplied to a selected string selection line, an unselected string selection line, a selected word line, unselected word lines, bit lines, and a ground selection line are described with reference to FIG. 4, and a description thereof will not be repeated herein in the interest of brevity.

Unlike operations discussed above with reference to FIG. 4, a nonvolatile memory device 100 adjusts a substrate voltage VBB to a negative voltage −VBB at T8. In some embodiments, a time T8 may be a time before a recovery period T5 to T6. A threshold voltage of a ground selection transistor GST formed on a substrate SUB is increased by a body effect by adjusting the substrate voltage VBB to a negative voltage −VBB. In some embodiments, a threshold voltage of the ground selection transistor GST is increased by threshold voltages of programmed memory cells.

In some embodiments, the substrate voltage VBB is adjusted to a negative voltage or a positive voltage according to a conductive type of the substrate SUB.

Figure 10:
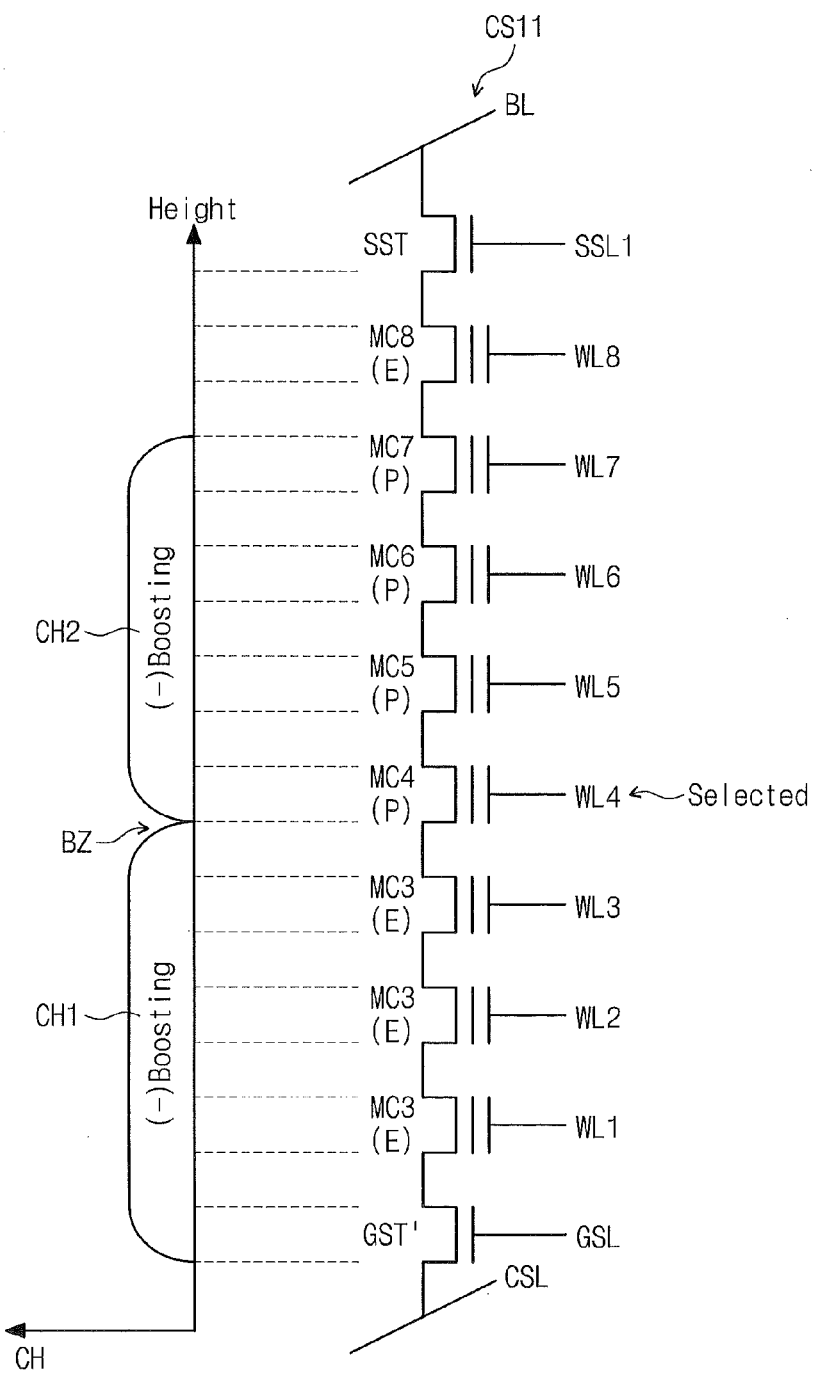
FIG. 10 is a diagram schematically illustrating a state of channels of a cell string experiencing a read operation described with reference to FIG. 9 according to some embodiments of the present inventive concept.

Referring now to FIG. 10, a diagram schematically illustrating a state of channels of a cell string performed a read operation described with reference to FIG. 9 will be discussed. Referring to FIGS. 9 and 10, a cell string CS11 comprises a string selection transistor SST, a ground selection transistor GST' and first to eighth memory cells MC1 to MC8.

In some embodiments, in the event that a negative voltage is applied as a substrate voltage, a threshold voltage of a ground selection transistor GST' is higher than a threshold voltage distribution of memory cells each having an erase state. In the event that a negative voltage is applied as the substrate voltage, a threshold voltage of the ground selection transistor GST' is higher than a threshold voltage distribution of memory cells each having a program state.

In other words, at T7 (refer to FIG. 6), the ground selection transistor GST' is at a turn-off state, so that a first channel CH1 shown in FIG. 10 is separated from a common source line CSL. In other words, first and second channels CH1 and CH2 have a floating state at T7, and potentials of the first and second channels CH1 and CH2 are negatively boosted. This means that potentials of the first and second channels CH1 and CH2 are lowered to a negative voltage. A potential difference is merely generated at a boundary zone BZ. Thus, hot electrons are not generated, so that read disturbance is prevented.

Figure 11:
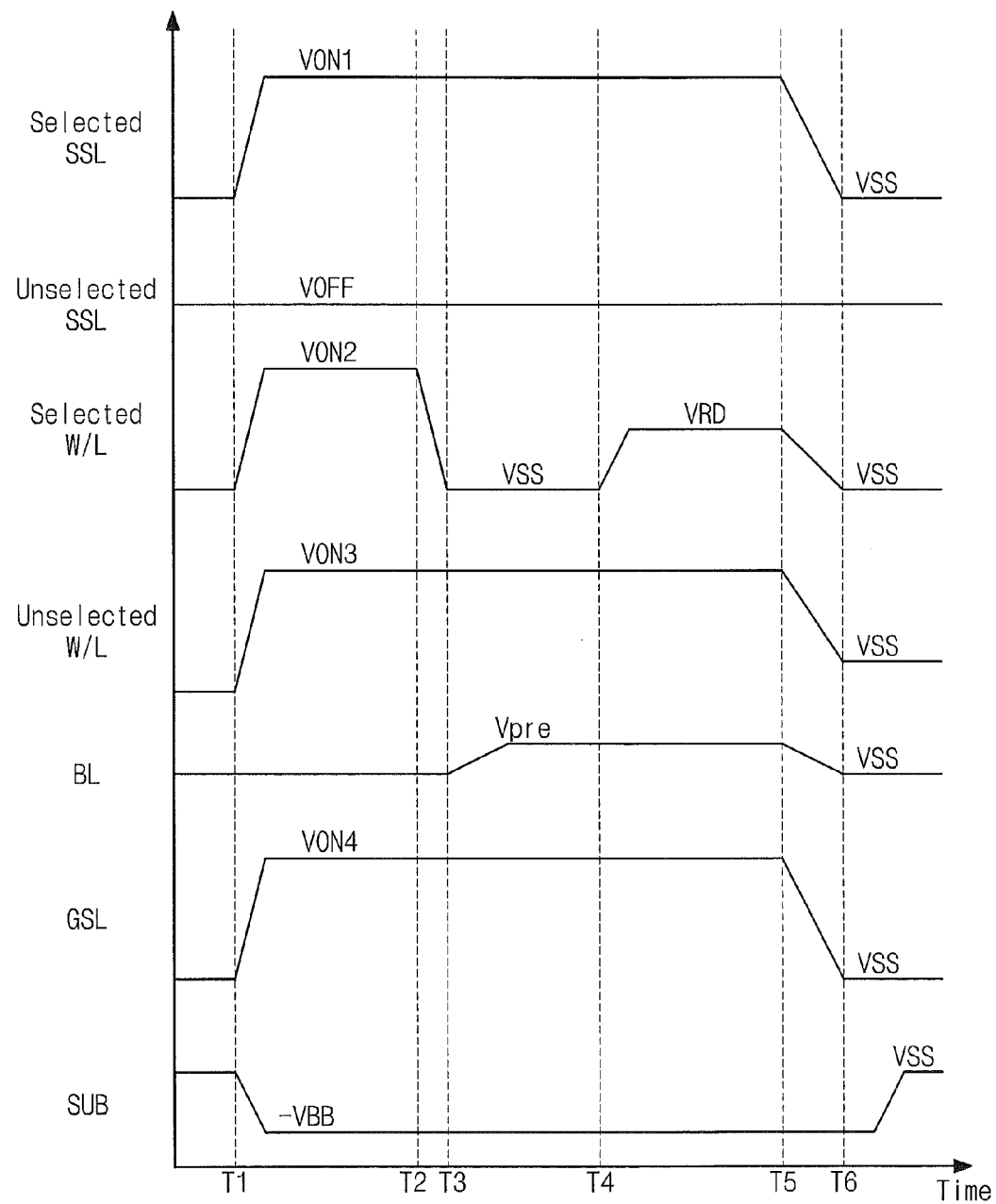
FIG. 11 is a timing diagram schematically illustrating operations of nonvolatile memory devices according to some embodiments of the inventive concept.

Referring now to FIG. 11, a timing diagram schematically illustrating an operation of a nonvolatile memory device according to some embodiments of the inventive concept will be discussed. As illustrated in FIG. 11, voltages supplied to a selected string selection line, an unselected string selection line, a selected word line, unselected word lines, bit lines, and a ground selection line are discussed above with reference to FIG. 4, and a therefore details thereof will be omitted in the interest of brevity.

Unlike a substrate voltage shown in FIG. 10, a substrate voltage VBB shown in FIG. 11 is adjusted to a negative voltage −VBB at T1. At this time, a threshold voltage of a ground selection transistor GST formed on a substrate SUB is increased by a body effect. However, since memory cells and string selection transistors are separated from the substrate SUB, they are not influenced by a variation of the substrate voltage VBB. Furthermore, although a threshold voltage of a ground selection transistor GST is increased, the ground selection transistor GST is at a turn-on state. The reason is that a fourth turn-on voltage VON4 supplied to a ground selection line GSL is higher than the increased threshold voltage of the ground selection transistor GST.

In other words, in the event that the substrate voltage VBB is controlled before a recovery period T5 to T6, it does not influence a read operation of a nonvolatile memory device. Furthermore, read disturbance may be reduced, or possibly prevented, by separating channels in cell strings from a common source line CSL during the recovery period T5 to T6.

In some embodiments, a time when the substrate voltage VBB is controlled, for example, when the substrate voltage VBB is changed, may be included between T1 and T5.

Figure 12:
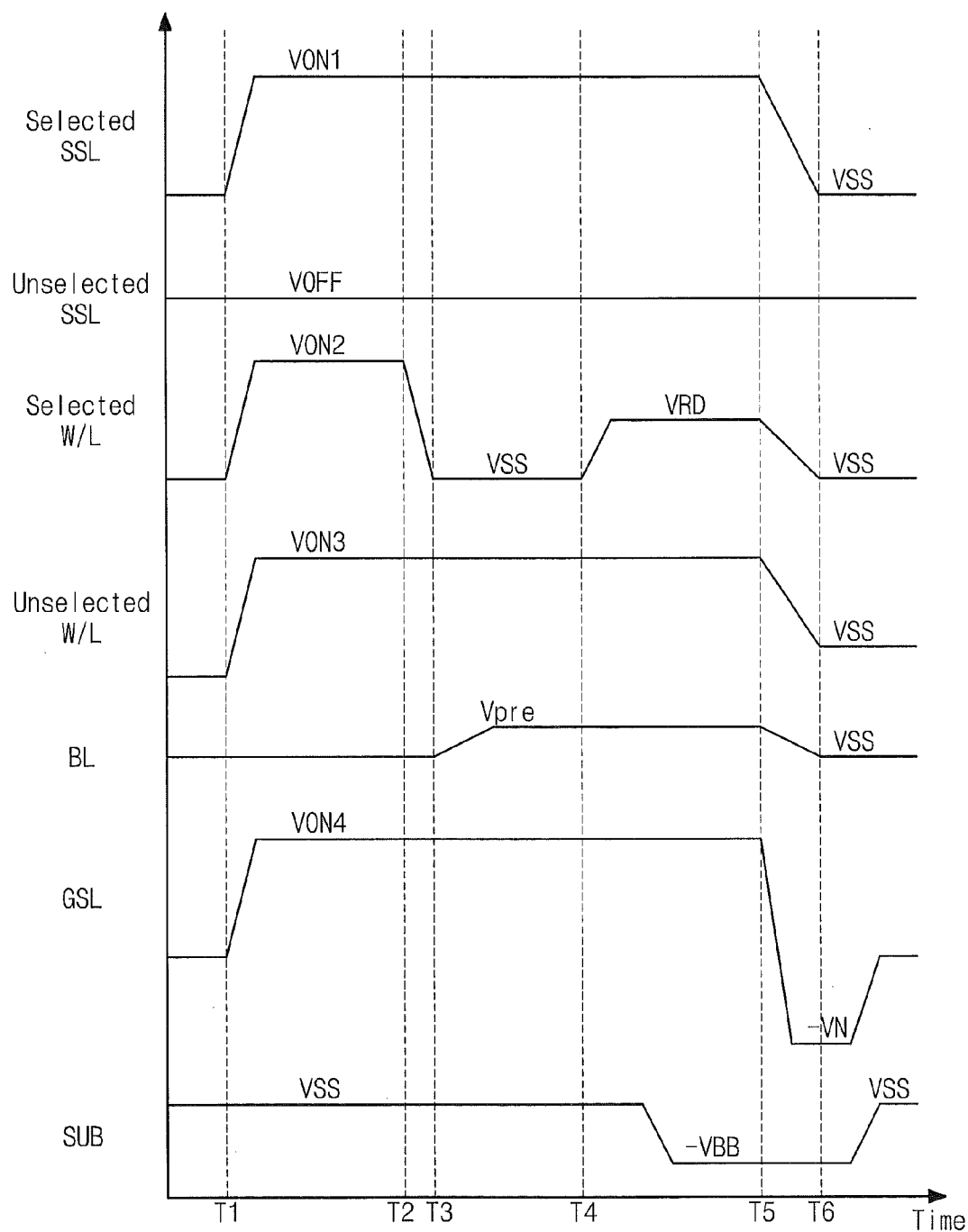
FIG. 12 is a timing diagram schematically illustrating operations of a nonvolatile memory device according to some embodiments of the inventive concept.

Referring now to FIG. 12, a timing diagram schematically illustrating an operation of a nonvolatile memory device according to some embodiments of the inventive concept will be discussed. Referring now to FIG. 12, voltages supplied to a selected string selection line, an unselected string selection line, a selected word line, unselected word lines, bit lines, and a ground selection line are described with reference to FIG. 4, and therefore details thereof will not be repeated herein in the interest of brevity.

As illustrated in FIG. 12, a substrate voltage VBB is lowered to a negative voltage −VBB at T8. Also, at T5 when a recovery period starts, a voltage of a ground selection line is lowered to a negative voltage −VN from a third turn-on voltage VON3. At this time, a time when a voltage of a ground selection line GSL reaches the negative voltage −VN is faster than T6 when the recovery period is ended.

A threshold voltage of the ground selection transistor GST is increased by lowering a voltage of the ground selection line GSL to the negative voltage −VN during the recovery period T5 to T6. For example, since a falling slope of a voltage of the ground selection line GSL is large, a turn-off time of the ground selection transistor GST becomes faster. In other words, a potential difference between channels is reduced by isolating a channel connected to a common source line CSL quickly. Thus, it may be possible to reduce, or possibly prevent, generation of hot electrons.

Figure 13:
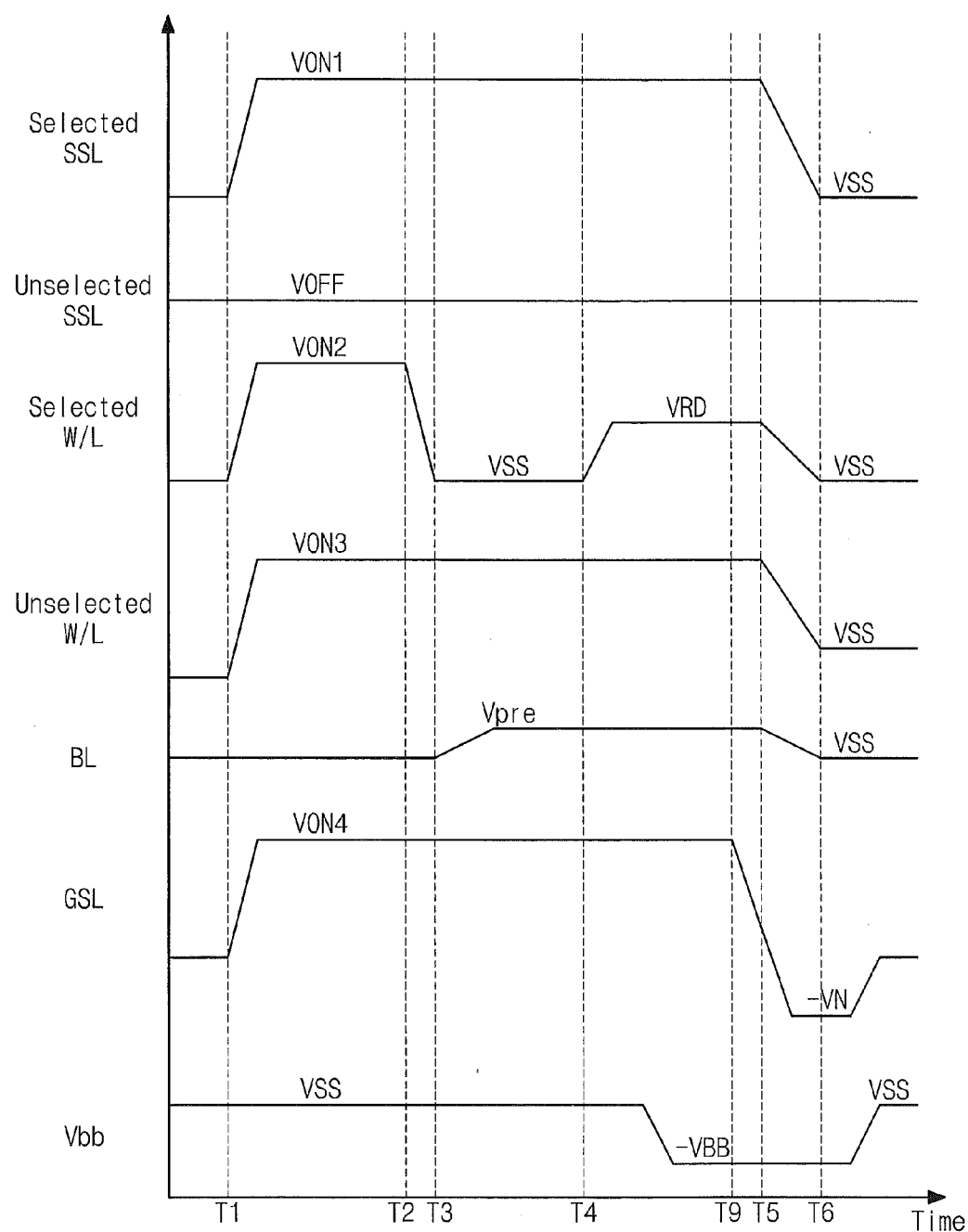
FIG. 13 is a timing diagram schematically illustrating operations of a nonvolatile memory device according to some embodiments of the inventive concept.

Referring now to FIG. 13, a timing diagram schematically illustrating an operation of a nonvolatile memory device according to some embodiments of the inventive concept will be discussed. Referring to FIG. 13, voltages supplied to a selected string selection line, an unselected string selection line, a selected word line, unselected word lines, bit lines, and a ground selection line are described with reference to FIG. 4, and therefore details thereof will be omitted in the interest of brevity.

As illustrated in FIG. 13, a substrate voltage VBB is lowered to a negative voltage −VBB at T8. Only, unlike FIG. 12, at T9, a voltage of a ground selection line GSL is lowered to a negative voltage −VN. T9 is included between a time when a state of a selected memory cell is determined and T5.

A threshold voltage of the ground selection transistor GST is increased by lowering a voltage of the ground selection line GSL to the negative voltage −VN at T9. For example, since a turn-on time of the ground selection transistor GST becomes faster, a time when a channel adjacent to a common source line is floated becomes faster. Thus, a potential difference between channels is reduced, so that generation of hot electrons is prevented.

Figure 14:
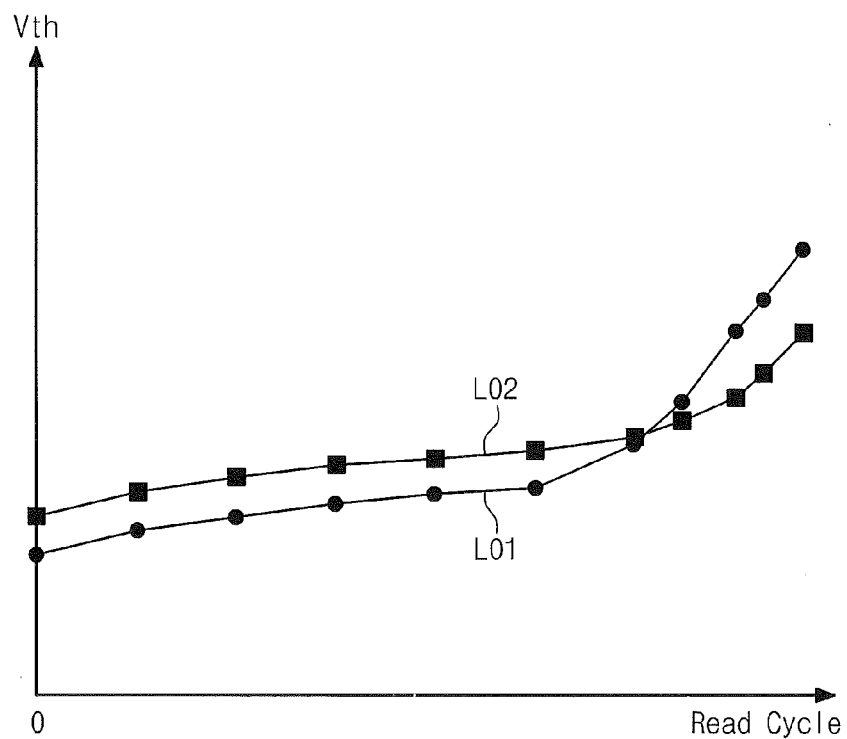
FIG. 14 is a graph illustrating that read disturbance is reduced at a read operation according to some embodiments of the inventive concept.

Referring now to FIG. 14, a graph for describing such an effect that read disturbance is reduced at a read operation according to some embodiments of the inventive concept will be discussed. In FIG. 14, the X-axis indicates the number of read operations and Y-axis indicates a variation in threshold voltages of adjacent memory cells. For ease of description, it is assumed that a fourth memory cell MC4 shown in FIG. 5 is a selected memory and a third memory cell MC3 is an adjacent memory cell.

Referring to FIGS. 5 and 14, a first line L01 (circles) shows the case that a substrate voltage VBB is a ground voltage VSS, and a second line L02 (squares) shows the case that the substrate voltage VBB is a negative voltage −VBB.

As illustrated in FIG. 14, as the number of read operations on the selected memory cell MC4 is increased, hot electrons are generated. This means that a threshold voltage of the adjacent memory cell MC3 is varied. At this time, referring to the first line L01 corresponding to embodiments where the substrate voltage VBB is not controlled, a threshold voltage of the adjacent memory cell MC3 is sharply varied after a particular read number. In these embodiments, the adjacent memory cell MC3 having an erase state is sensed as a program state.

Referring to the second line L02 corresponding to embodiments where the substrate voltage VBB is adjusted to a negative voltage, a variation in a threshold voltage of the adjacent memory cell MC3 is reduced as compared with the first line L01. This means that read disturbance is reduced.

It will be understood that embodiments of the inventive concept are not limited to a three-dimensional flash memory. For example, the inventive concept may be applicable to a nonvolatile memory device that includes a channel film electrically separated from a substrate, memory cells formed on the channel film, a string selection transistor formed on the substrate to connect the channel film and a bit line, and a ground selection transistor formed on the substrate to connect the channel film and a common source line without departing from the scope of the present inventive concept as will be discussed below with respect to FIGS. 15 and 16.

Figure 15:
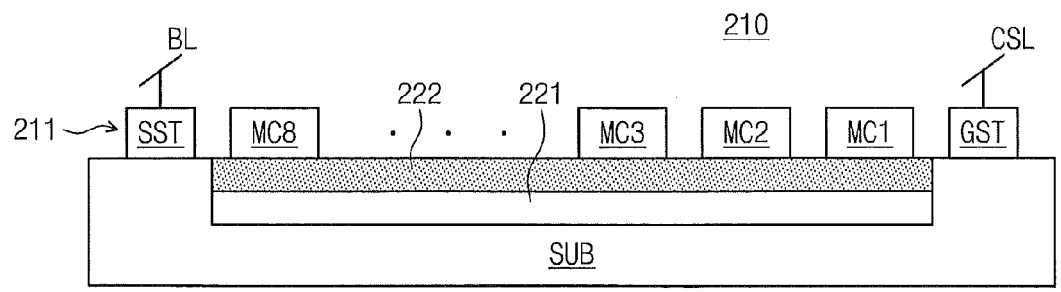
FIGS. 15 and 16 are diagrams schematically illustrating a memory cell array according to some embodiments of the inventive concept.
Figure 16:
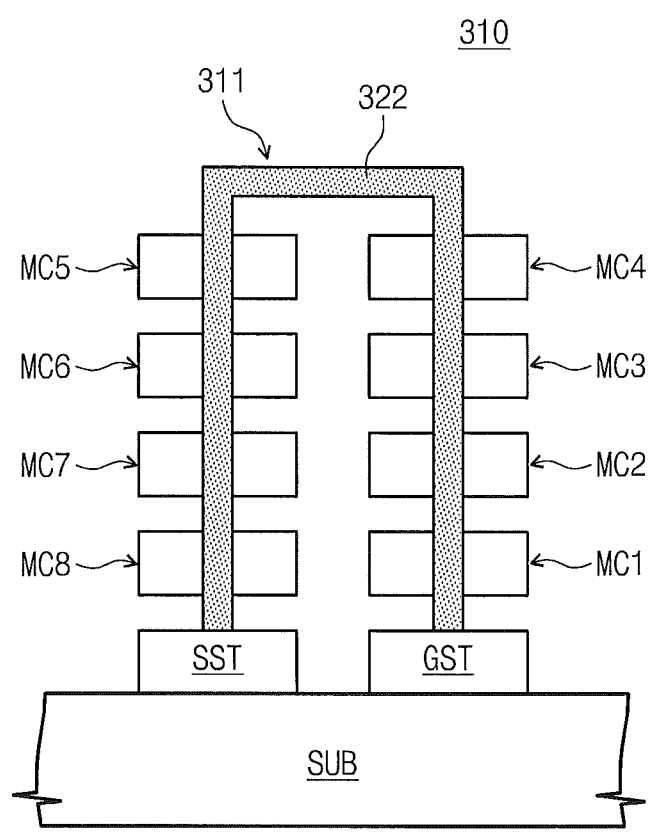

Referring now to FIGS. 15 and 16, diagrams schematically illustrating a memory cell array according to some embodiments of the inventive concept will be discussed. For ease of description, a cell string is illustrated in FIGS. 15 and 16. However, embodiments of the present inventive concept is not limited thereto. A memory cell array may comprise a plurality of cell strings without departing from the scope of the present inventive concept.

Referring now to FIG. 15, a memory cell array 210 comprises a cell string 211. The cell string 211 is formed on a substrate SUB. The cell string 211 comprises first to eighth memory cells MC1 to MC8, a ground selection transistor GST, and a string selection transistor SST.

An insulation film 221 is formed on the substrate SUB, and a channel film 222 is formed on the insulation film 221. In other words, the channel film 222 is formed to be electrically isolated from the substrate SUB. The insulation film 221 may include an insulation material such as silicon oxide. The channel film 222 is formed of a semiconductor material having the same conductive type as that of the substrate SUB. In some embodiments, the channel film 222 may be formed of a thin film semiconductor material, for example, thin-poly.

A plurality of memory cells MC1 and MC8 are formed on the channel film 222. The memory cells MC1 and MC8 may be, for example, charge trap type memory cells.

The string selection transistor SST is provided between one end of the channel film 222 and a bit line BL. The string selection transistor SST is formed on the substrate SUB.

The ground selection transistor GST is provided between the other end of the channel film 222 and a common source line CSL. The ground selection transistor GST is formed on the substrate SUB.

As illustrated in FIG. 16, a memory cell array 310 comprises a cell string 311. The cell string 311 is provided on a substrate SUB. The cell string 311 comprises first to eighth memory cells MC1 to MC8, a ground selection transistor GST, and a string selection transistor SST.

The first to eighth memory cells MC1 to MC8 are stacked in a direction perpendicular to the substrate SUB. The first to eighth memory cells MC1 to MC8 are connected through a channel film 322. The string and ground selection transistors SST and GST are formed on the substrate SUB. The ground selection transistor GST is provided between the first memory cell MC1 and the substrate SUB, and the string selection transistor SST is provided between the eighth memory cell MC8 and the substrate SUB. In some embodiments, the channel film 322 may be formed of a thin film semiconductor material, for example, thin-poly.

As discussed with respect to FIGS. 15 and 16, the cell strings 211 and 311 include a thin film channel that is electrically isolated from the substrate SUB. Also, at least one of the ground selection transistor GST and the string selection transistor SST is provided between the channel film and the substrate SUB. In embodiments where a cell string having the above-described structure, as described with reference to FIGS. 4 to 7, read disturbance occurs. For example, hot electrons are generated due to a potential difference between channels. If a substrate voltage is adjusted as described with reference to FIGS. 8 to 14, the read disturbance is reduced. In these embodiments, since the channel film is electrically isolated from the channel film, memory cells are not influenced by a variation in the substrate voltage.

A cell string structure according to some embodiments of the inventive concept is described with reference to FIGS. 15 and 16. However, the inventive concept is not limited thereto. For example, a nonvolatile memory device according to the inventive concept comprises a plurality of cell strings, each of which includes a channel film isolated from a substrate, a plurality of memory cells formed on the channel film, a string selection transistor provided between the channel film and a bit line, and a ground selection transistor for provided between the channel film and a common source line, wherein at least one of the string selection transistor and the ground selection transistor is formed on the substrate. The inventive concept described with reference to FIGS. 1 to 15 are applicable to a nonvolatile memory device including, or formed to have, the above-described structures.

Figure 17:
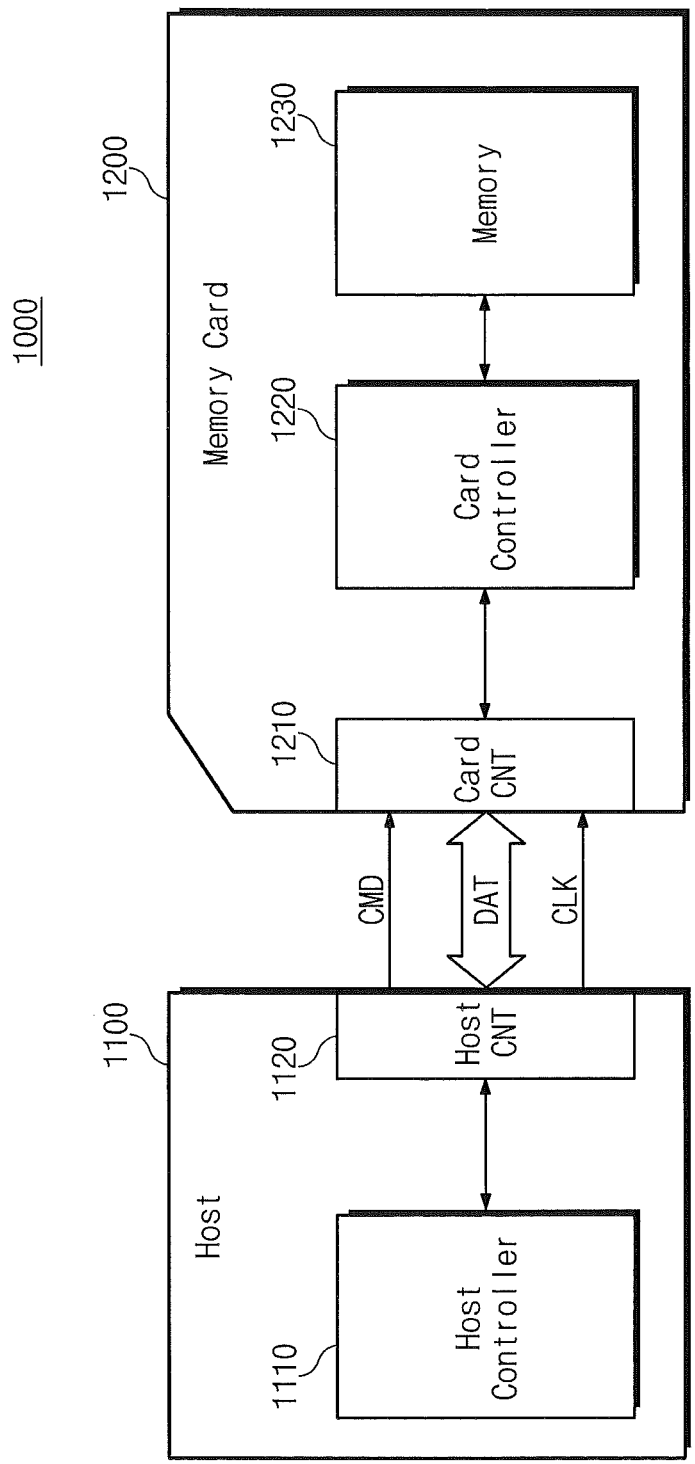
FIG. 17 is a block diagram schematically illustrating a memory card that can be used in combination with a nonvolatile memory device according to some embodiments of the inventive concept.

Referring now to FIG. 17, a block diagram schematically illustrating a memory card to which a nonvolatile memory device according to some embodiments of the inventive concept is applied. A memory card system 1000 comprises a host 1100 and a memory card 1200. The host 1100 comprises a host controller 1110 and a host connection unit 1120. The memory card 1200 comprises a card connection unit 1210, a card controller 1220, and a flash memory 1230. In these embodiments, the flash memory 1230 is implemented by a three-dimensional flash memory described with reference to FIG. 1 through 14.

The host 1100 writes data at the memory card 1200 and reads data from the memory card 1200. The host controller 1110 sends a command, for example, a write command, a clock signal CLK generated from a clock generator in the host 1100 and data to the memory card 1200 through the host connection unit 1120.

The card controller 1220 stores data in the flash memory 1230 in response to a command input via the card connection unit 1210. The data may be stored in synchronization with a clock signal generated from a clock generator in the card controller 1220. The flash memory 1230 stores data transferred from the host 1100. For example, in embodiments where the host 1100 is a digital camera, the memory card 1200 may store image data.

Figure 18:
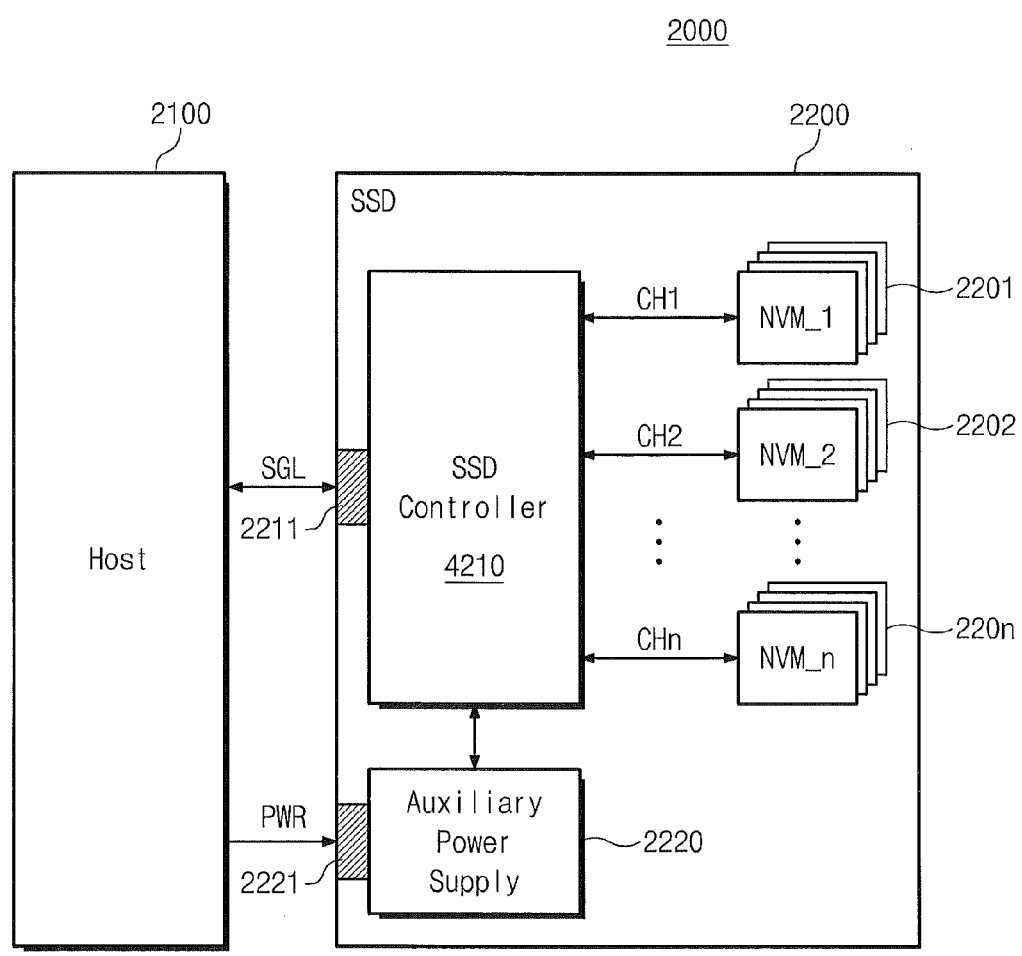
FIG. 18 is a block diagram illustrating a solid state drive that may be used in combination with a nonvolatile memory device according to some embodiments of the inventive concept.

Referring now to FIG. 18, a block diagram illustrating a solid state drive to which a nonvolatile memory device according to some embodiments of the inventive concept is applied will be discussed. As illustrated in FIG. 18, a solid state drive (SSD) system 2000 comprises a host 2100 and an SSD 2200.

The SSD 2200 exchanges signals SGL with the host 2100 through a host connector 2211, and is supplied with a power through a power connector 2221. The SSD 2200 comprises a plurality of nonvolatile memories 2201 to 220n, an SSD controller 2210, and an auxiliary power supply 2220.

The plurality of nonvolatile memories 2201 to 220n may be used as a storage medium of the SSD 2200. The SSD 2200 may use not only a flash memory but also nonvolatile memory devices, such as PRAM, MRAM, ReRAM, FRAM, and the like. The plurality of nonvolatile memories 2201 to 220n is connected to the SSD controller 2210 through a plurality of channels CH1 to CHn. One channel may be connected to one or more nonvolatile memories. Nonvolatile memories connected to one channel may be connected to the same data bus.

The SSD controller 2210 exchanges signals SGL with the host 2100 through the signal connector 2211. The signals SGL may include a command, an address, data, etc. The SSD controller 2210 is configured to write or read out data to or from a corresponding nonvolatile memory according to a command of the host 2100. The SSD controller 2210 will be more fully described with reference to FIG. 20.

The auxiliary power supply 2220 is connected to the host 2100 via the power connector 2221. The auxiliary power supply 2220 is charged by a power PWR from the host 2100. The auxiliary power supply 2220 may be placed inside or outside the SSD 2200. For example, the auxiliary power supply 2220 may be put on a main board to supply an auxiliary power to the SSD 2200.

Figure 19:
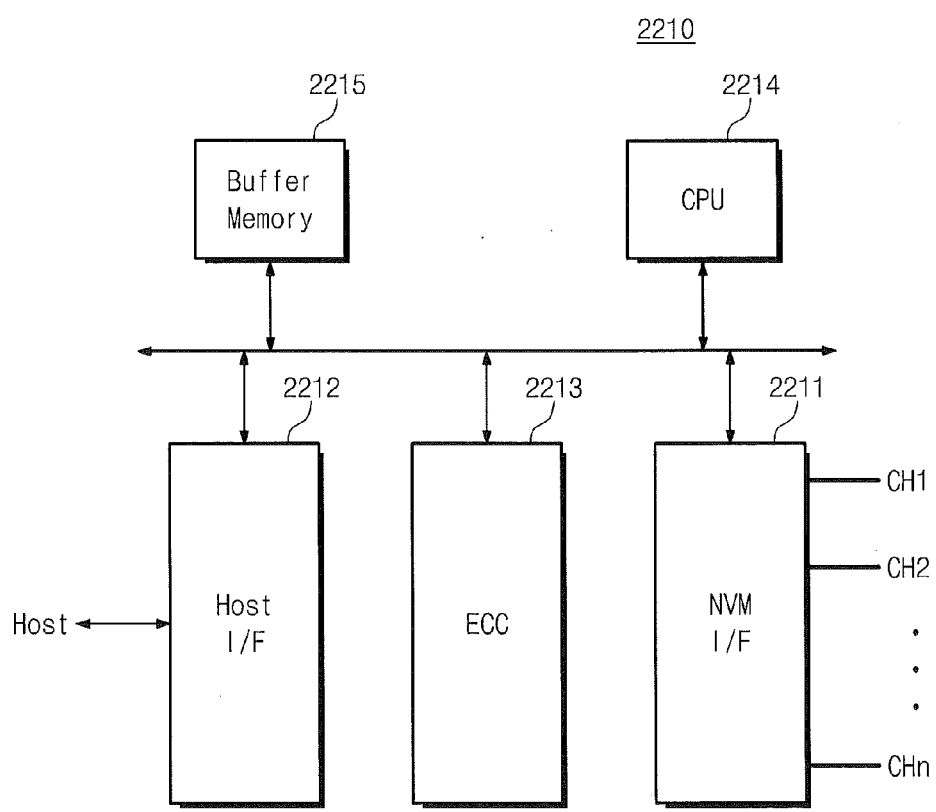
FIG. 19 is a block diagram schematically illustrating an SSD controller 2210 illustrated in FIG. 18 in accordance with some embodiments of the present inventive concept.

Referring now to FIG. 19, a block diagram schematically illustrating an SSD controller 2210 shown in FIG. 18 will be discussed. Referring to FIG. 19, an SSD controller 2210 comprises an NVM interface 2211, a host interface 2212, an ECC circuit 2213, a control processing unit 2214, and a buffer memory 2215.

The NVM interface 2211 may scatter data transferred from the buffer memory 2215 to channels CH1 to CHn. The NVM interface 2211 sends data read from nonvolatile memories 2201 to 220n to the buffer memory 2215. In these embodiments, the NVM interface 2211 uses a flash memory interface manner. In other words, the SSD controller 2210 performs program, read and erase operations according to the flash memory interface manner.

The host interface 2212 provides an interface with an SSD 2200 according to the protocol of the host 2100. The host interface 2212 may communicate with the host 2100 using USB (Universal Serial Bus), SCSI (Small Computer System Interface), PCI express, ATA, PATA (Parallel ATA), SATA (Serial ATA), SAS (Serial Attached SCSI), or the like. The host interface 2212 may also perform a disk emulation function which enables the host 2100 to recognize the SSD 2200 as a hard disk drive (HDD).

The ECC circuit 2213 generates error correction codes using data transferred to the flash memories 2201 to 220n. The error correction codes may be stored in spare areas of the flash memories 2201 to 220n. The ECC circuit 2213 detects an error of data read from the flash memories 2201 to 220n. If the detected error is correctable, the ECC circuit 2213 corrects the detected error.

The central processing unit 2214 analyzes and processes signals SGL input from a host 2100 (refer to FIG. 18). The central processing unit 2214 controls the host 2100 through the host interface 2212 and the flash memories 2201 to 220n through the NVM interface 2211. The central processing unit 2214 controls the flash memories 2201 to 220n according to firmware for driving the SSD 2200.

The buffer memory 2215 temporarily stores write data provided from the host 2100 or data read from a flash memory. The buffer memory 2215 stores metadata to be stored in the flash memories 2201 to 220n or cache data. At a sudden power-off operation, metadata or cache data stored in the buffer memory 2215 is stored in the flash memories 2201 to 220n. The buffer memory 2215 includes DRAM, SRAM, and the like.

Figure 20:
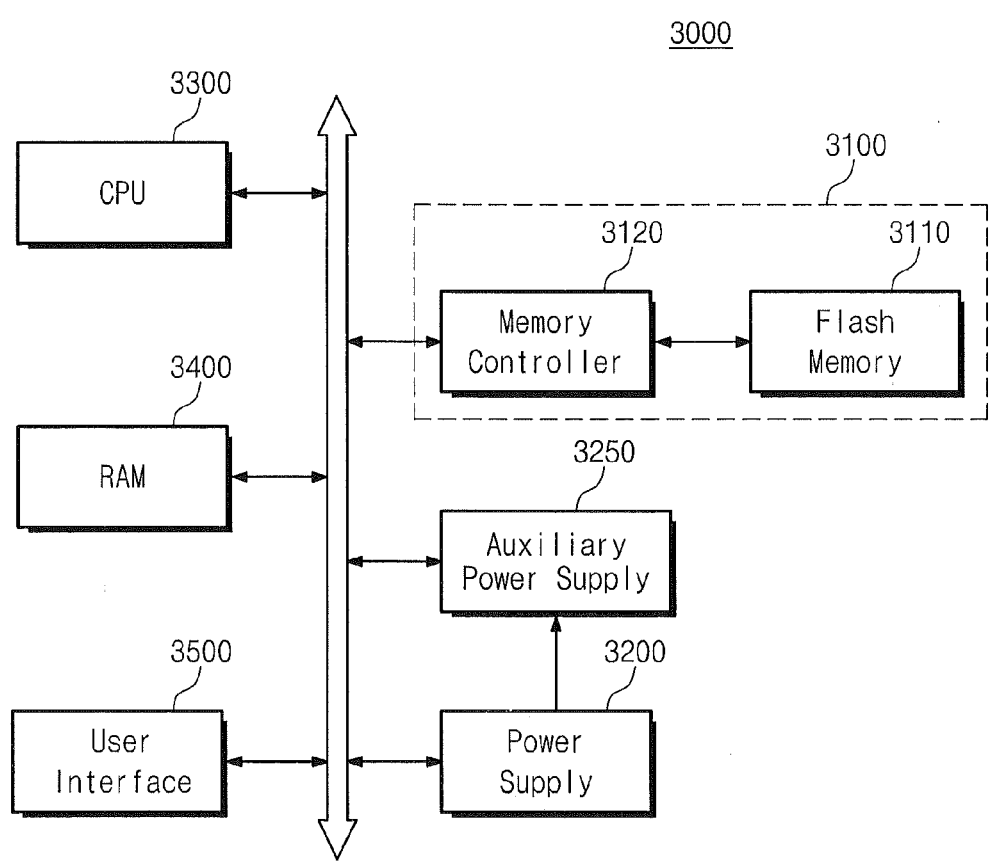
FIG. 20 is a block diagram schematically illustrating an electronic device that may be used in combination with a nonvolatile memory device according to some embodiments of the inventive concept.

Referring now to FIG. 20, a block diagram schematically illustrating an electronic device to which a nonvolatile memory device according to some embodiments of the inventive concept is applied will be discussed. In these embodiments, an electronic device 3000 may be one of electronic devices such as a computer, a ultra-mobile personal computer (UMPC), a workstation, a net-book, a personal digital assistance (PDA), a portable computer (PC), a web tablet, a wireless phone, a mobile phone, a smart phone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, etc.

As illustrated in FIG. 20, the electronic device 3000 comprises a memory system 3100, a power supply device 3200, an auxiliary power supply 3250, a CPU 3300, a RAM 3400, and a user interface 3500. The memory system 3100 comprises a flash memory 3110 and a memory controller 3120. In these embodiments, the flash memory 3110 may be a nonvolatile memory device having a three-dimensional memory structure described with reference to FIGS. 1 to 14.

Figure 21:
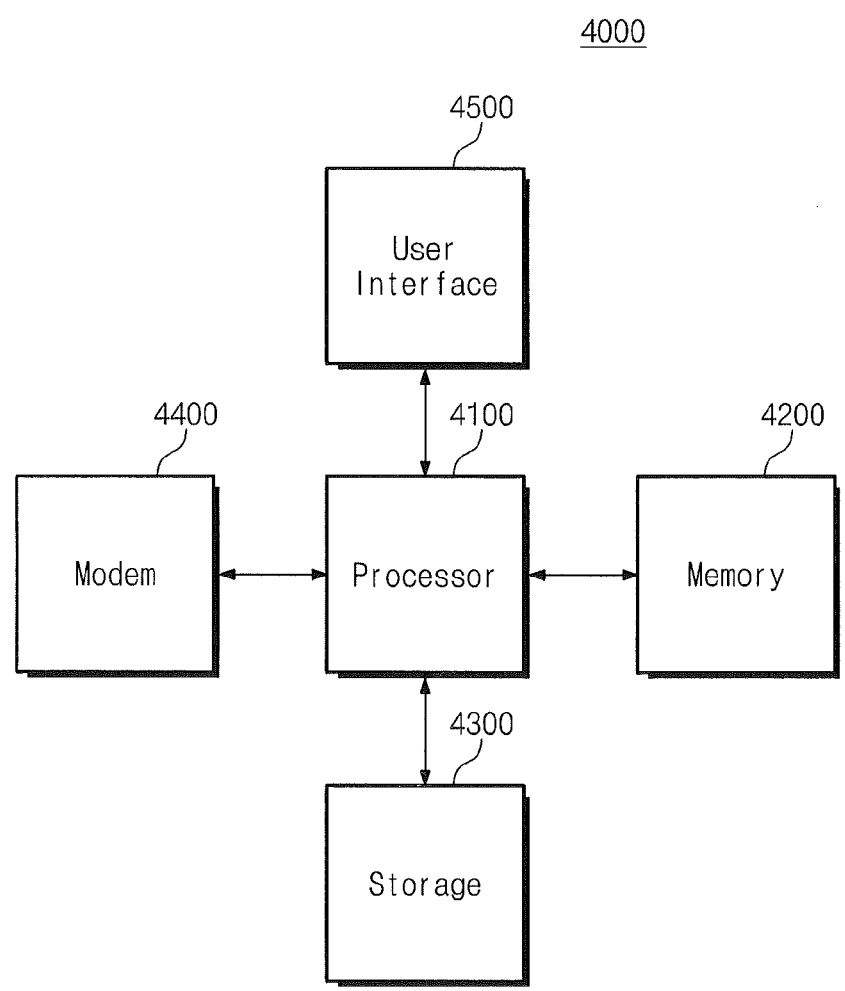
FIG. 21 is a block diagram schematically illustrating a mobile system that may be used in combination with a nonvolatile memory device according to some embodiments of the inventive concept.

Referring now to FIG. 21, a block diagram schematically illustrating a mobile system to which a nonvolatile memory device according to some embodiments of the inventive concept is applied. As illustrated in FIG. 21, a mobile system 4000 comprises a processor 4100, a memory 4200, storage 4300, a modem 4400, and a user interface 4500.

The processor 4100 controls an overall operation of the mobile system 4000, and may perform a logical operation. The processor 4100 is formed of a system-on-chip (SoC). The processor 4100 may be a general purpose processor or an application processor.

The memory 4200 communicates with the processor 4100. The memory 4200 is a working memory (or, a main memory) of the processor 4100 or the mobile system 4000. The memory 4200 may include a volatile memory such as a static RAM, a dynamic RAM, a synchronous DRAM, etc. or a nonvolatile memory such as a flash memory, a Phase-change RAM (PRAM), a Magnetic RAM (MRAM), a Resistive RAM (RRAM), a Ferroelectric RAM (FRAM), etc.

The storage 4300 is main storage of the mobile system 4000. The storage 4300 is used to store data for a long time. The storage 4300 includes a hard disk drive or a nonvolatile memory such as a flash memory, a PRAM (Phase-change RAM), an MRAM (Magnetic RAM), an RRAM (Resistive RAM), an FRAM (Ferroelectric RAM), etc. The storage 3300 includes a memory system according to an embodiment of the inventive concept.

The storage 4300 may be a nonvolatile memory device described with reference to FIGS. 1 to 16. As described with reference to FIGS. 1 to 16, the storage 4300 adjusts a substrate voltage. VBB such that threshold voltages of ground selection transistors are increased during a read operation. The storage 4300 recovers a voltage of a ground selection line prior to voltages of other lines. The storage 4300 applies a negative voltage to a ground selection line.

In some embodiments, the memory 4200 and the storage 4300 may be formed of the same type of nonvolatile memory. In these embodiments, the memory 4200 and the storage 4300 may be integrated into a semiconductor integrated circuit.

The modem 4400 communicates with an external device according to a control of the processor 4100. For example, the modem 4400 communicates with the external device in a wire or wireless manner. The modem 4400 may communicate based on at least one of wireless communications manners such as LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on or wire communications manners such as USB (Universal Serial Bus), SATA (Serial AT Attachment), SCSI (Small Computer Small Interface), Firewire, PCI (Peripheral Component Interconnection), etc.

The user interface 4500 communicates with a user according to a control of the processor 4100. For example, the user interface 4500 may include user input interfaces such as a keyboard, a keypad, a button, a touch panel, a touch screen, a touch pad, a touch ball, a camera, a microphone, a gyroscope sensor, a vibration sensor, etc. The user interface 4500 may further include user output interfaces such as an LCD, an OLED (Organic Light Emitting Diode) display device, an AMOLED (Active Matrix OLED) display device, an LED, a speaker, a motor, etc.

As discussed briefly above, embodiments of a nonvolatile memory device controls a substrate voltage such that a threshold voltage of a ground selection transistor is increased during a read operation. In these embodiments, channels are isolated from a common source line during a recovery period of a read operation. Thus, a potential difference between locally boosted channels may be reduced and hot electrons generated at a boundary zone may be reduced. Accordingly, read disturbance may be reduced.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device comprising:
    a memory cell array having a plurality of cell strings, each cell string comprising:
        a plurality of memory cells stacked in a direction perpendicular to a substrate, a ground selection transistor between the plurality of memory cells and the substrate, and a string selection transistor between the plurality of memory cells and a bit line;
        an address decoder coupled to the plurality of memory cells in the plurality of cell strings through word lines, to the string selection transistors in the plurality of cell strings through string selection lines, and to the ground selection transistors in the plurality of cell strings through a ground selection line;
        a read/write circuit coupled to the string selection transistors in the plurality of cell strings through the bit lines; and
        control logic configured to adjust a substrate voltage applied to the substrate such that threshold voltages of the ground selection transistors are higher than a predetermined level during read operations for at least one of the plurality of memory cells in the plurality of cell strings.

2. The nonvolatile memory device of claim 1, wherein the predetermined level is higher than one of a threshold voltage distribution of erase states of the plurality of memory cells and a threshold voltage distribution of program states of the plurality of memory cells.

3. The nonvolatile memory device of claim 2:
    wherein the substrate comprises a p-type substrate; and
    wherein the control logic is configured to adjust the substrate voltage to a negative voltage when the substrate is p-type.

4. The nonvolatile memory device of claim 2:
    wherein the substrate comprises an n-type substrate; and
    wherein the control logic is configured to adjust the substrate voltage to a positive voltage when the substrate is n-type.

5. The nonvolatile memory device of claim 1, wherein the read operation comprises an operation where a selection read voltage is applied to a selected one of the word lines and a non-selection read voltage is applied to an unselected one of the word lines and a recovery operation wherein the non-selection read voltage applied is lowered to a ground voltage.

6. The nonvolatile memory device of claim 5, wherein the control logic is configured to supply the adjusted substrate voltage to the substrate before the recovery operation.

7. The nonvolatile memory device of claim 6, wherein the control logic is configured to adjust the adjusted substrate voltage to ground voltage after the recovery operation is completed.

8. The nonvolatile memory device of claim 5, wherein the control logic is configured to start to lower a voltage supplied to the ground selection line to a negative voltage when the recovery operation is started.

9. The nonvolatile memory device of claim 5, wherein the control logic is configured to lower a voltage supplied to the ground selection line to a negative voltage before the recovery operation.

10. A method of operating a nonvolatile memory device that includes a plurality of cell strings, each cell string including a plurality of memory cells stacked in a direction perpendicular to a substrate, a ground selection transistor between the plurality of memory cells and the substrate, and a string selection transistor between the plurality of memory cells and a bit line, the method comprising:
    performing a read operation on at least one of the plurality of memory cells in the plurality of cell strings; and
    adjusting a substrate voltage supplied to a substrate such that a threshold voltage of the ground selection transistor is higher than a predetermined level during the read operation.

11. The method of claim 10, wherein performing a read operation comprises:
    applying a selection read voltage to a selected word line and a non-selection read voltage to an unselected word line; and
    performing a recovery operation in which the applied selection read voltage and non-selection read voltage are lowered to a ground voltage.

12. The method of claim 11, wherein adjusting the substrate voltage comprises adjusting the substrate voltage before the recovery operation.

13. The method of claim 12, wherein adjusting the substrate voltage further comprises adjusting the adjusted substrate voltage to a ground voltage after the recovery operation is complete.

14. The method of claim 11, further comprising lowering a voltage supplied to the ground selection line to a negative voltage during the recovery operation.

15. The method of claim 11, further comprising lowering a voltage supplied to the ground selection line to a negative voltage before the recovery operation.

16. The method of claim 10:
    wherein each cell string includes a channel film isolated from the substrate;
    wherein the plurality of memory cells are formed on the channel film;
    wherein the string selection transistor is between the channel film and a bit line;
    wherein the ground selection transistor is between the channel film and a common source line;
    wherein at least one of the string and ground selection transistors are formed on the substrate; and
    wherein adjusting a substrate voltage supplied to the substrate further comprising adjusting the substrate voltage supplied to the substrate such that the threshold voltage of at least one of the string and ground selection transistors is higher than a predetermined level during the read operation.

17. A method of operating a non-volatile memory device, comprising:
    controlling a substrate voltage such that a threshold voltage of a ground selection transistor increases during a read operation, wherein controlling the substrate voltage comprises:
        isolating channels from a common source line during a recovery period of the read operation; and
        reducing a potential difference between locally boosted channels and hot electrons generated at a boundary zone.

18. The method of claim 17,
    wherein the non-volatile memory device includes a plurality of cell strings, each cell string including a plurality of memory cells stacked in a direction perpendicular to a substrate, a ground selection transistor between the plurality of memory cells and the substrate, and a string selection transistor between the plurality of memory cells and a bit line; and
    wherein controlling the substrate voltage is preceded by performing the read operation on at least one of the plurality of memory cells in the plurality of cell strings.

19. The method of claim 18, wherein controlling the substrate voltage further comprises adjusting the substrate voltage supplied to a substrate such that a threshold voltage of the ground selection transistor is higher than a predetermined level during the read operation.

20. The method of claim 19, further comprising one of:
    lowering a voltage supplied to the ground selection line to a negative voltage during the recovery period; and
    lowering a voltage supplied to the ground selection line to a negative voltage before the recovery period.

* * * * *